United States Patent [19]

Inui et al.

[11] Patent Number: 5,103,113
[45] Date of Patent: Apr. 7, 1992

[54] DRIVING CIRCUIT FOR PROVIDING A VOLTAGE BOASTED OVER THE POWER SUPPLY VOLTAGE SOURCE AS A DRIVING SIGNAL

[75] Inventors: Takashi Inui, Dallas; Shunichi Sukegawa, Plano, both of Tex.

[73] Assignee: Texas Instruments Incorporated, Dallas, Tex.

[21] Appl. No.: 537,554

[22] Filed: Jun. 13, 1990

[51] Int. Cl.$^5$ .................. H03K 3/01; H03K 19/02; H03K 19/0175; G11C 7/00
[52] U.S. Cl. .................. 307/270; 307/446; 307/449; 307/475; 365/203; 365/226; 365/228
[58] Field of Search ............ 307/270, 448, 449, 451, 307/452, 310, 446, 475; 365/203, 226, 228

[56] References Cited

U.S. PATENT DOCUMENTS

| | | | |
|---|---|---|---|
| 4,645,948 | 2/1987 | Morris et al. | 307/310 |
| 4,730,132 | 3/1988 | Watanabe et al. | 307/448 |
| 4,780,626 | 10/1988 | Guerin et al. | 307/448 |
| 4,797,580 | 1/1989 | Sunter | 307/448 |

Primary Examiner—Stanley D. Miller
Assistant Examiner—Trong Phan
Attorney, Agent, or Firm—William E. Hiller; N. Rhys Merrett; Melvin Sharp

[57] ABSTRACT

A driving circuit for providing a predetermined voltage as a driving signal to a respective word line in a dynamic random access memory in a short time. The driving circuit includes an operation signal supply circuit portion for providing an operation signal, a driving signal output circuit portion which receives the operation signal and provides a driving signal as an output, and a voltage supply circuit portion for providing a predetermined voltage to the driving signal output circuit portion in producing the driving signal. A bipolar switching element is provided in the driving signal output circuit portion to control the voltage supply from the voltage supply circuit portion and responds to the operation signal to provide the voltage from the voltage supply circuit portion as the voltage producing the driving signal in a short time.

15 Claims, 17 Drawing Sheets

DRIVING CIRCUIT FOR PROVIDING A VOLTAGE BOASTED OVER THE POWER SUPPLY VOLTAGE SOURCE AS A DRIVING SIGNAL

BACKGROUND OF THE INVENTION

1. Field of the Invention

This invention concerns a driving circuit, such as a driving circuit suitable for driving the word lines, etc., in a dynamic RAM (Random Access Memory).

2. Description of the Prior Art

In conventional techniques of dynamic RAM design, the most important point is to increase the difference $\Delta V$ between the bit line voltage representing information "1" and that representing information "0." Assume that the bit line capacitance is $C_B$, the cell capacitance is $C_S$, the cell voltage with information "1" stored is $V_H$, and the cell voltage with information "0" stored is $V_L$, $\Delta V$ can then be represented as $$\Delta V = \frac{V_H - V_L}{1 + C_B/C_S}$$

As can be seen from the above equation, one way to increase $\Delta V$ is to reduce the ratio $C_B/C_S$, which depends on the memory cell structure and the number of memory cells coupled to a single bit line. Another way is to increase the value of said $(V_H - V_L)$ in the circuit. However, $V_L$ (cell voltage for stored information "0") is usually 0V, while $V_H$ (cell voltage for stored information "1") depends on the voltage $V_{WL}$ when the word lines are open. Assume that the word line voltage $V_{WL}$ is set as power supply voltage $V_{DD}$, and the threshold voltage of the transfer gate of the memory cell is $V_T$ (WL), then $$V_H = V_{DD} - V_T(WL)$$

Hence, $V_H$ is lower than power supply voltage $V_{DD}$ by an amount equal to the threshold voltage (this, of course, decreases said value of $(V_H - V_L)$, making it impossible to increase the bit line voltage difference $\Delta V$). In order to solve this problem, various techniques related to circuits have been proposed to raise the word line voltage $V_{WL}$ higher than the power supply voltage $V_{DD}$ (i.e., $V_{WL} > V_{DD} + V_T(WL)$).

An increase in the said bit line voltage difference $\Delta V$ not only can increase the operating margin of the dynamic RAM, it is also effective in providing an improvement against so-called soft errors caused by -particles, etc.

In the following, we will discuss the problems in an example of the conventional circuit technique for raising said word line voltage $V_{WL}$ to a level above the power supply voltage $V_{DD}$, with reference to FIGS. 12-17.

First of all, FIG. 14 is a schematic block diagram of the circuit from RAS (Row Address Strobe) of, for example, a 1 M dynamic RAM to various word lines (for example, 512 lines). Its major operation mode can be explained as follows.

As shown in FIG. 14, a clock signal (RL21) generated by RAS clock generator (1), for generating the operating clock of the RAS system upon the arrival of RAS, controls address buffer (2) and booster circuit portion (4). At the falling edge of RAS, address ($A_0$–$A_8$) is fetched by clock (RL21 into address buffer (2); the outputs of address buffer (2) (RA0, RA0–RA7, RA7) are predecoded by predecoder (3). Among the outputs from the predecoder, the upper bits (RF4)–(RF15), RA8, and RA8 are sent to X decoder portion (5); the lower bits (RF0)–(RF3) are sent to booster circuit portion (4), respectively, and used for control. At X decoder portion (5), each decoder is selected therewithin by the above RF4–RF15, RA8, and RA8. Finally, with the aid of four clocks RXH0–RXH3 formed by booster circuit portion (4) and connected to word line driving circuit (6), one word line out of the 512 word lines (WL0–WL511) is selected.

FIGS. 15 and 16 illustrate each connection relationship as well as operation of word line driving circuit portion (6), X decoder portion (5), and booster circuit portion (4) in FIG. 14.

As shown in FIG. 15, X decoder portion (5) is made of 4-input AND circuits, with a total number of 128 ($4 \times 4 \times 4 \times 2 = 128$) said 4-input AND circuits (5a) being made of the various combinations of inputs RF4–RF7, RF8–RF11, RF12–RF15, RA8 and RA8, respectively (only one 4-input AND circuit (5a) is shown in FIG. 15 to simplify the explanation). The output of each said 4-input AND circuit (5a) is connected to one of the inputs of four 2-input AND circuits (6a) in word line driving circuit portion (6), respectively. The other inputs of these AND circuits (6a) are connected to RXH0–RXH3, output signals from booster circuit portion (4) as shown in FIG. 14. The output of each of said four 2-input AND circuits (6a) is connected to four word lines (such as WL0–WL3). That is, in the circuit shown in FIG. 15, each circuit group contains one 4-input AND circuit (5a) and four 2-input AND circuits (6a); for the said 4-input AND circuit (5a), there are 128 combinations of inputs; each of the 128 circuits has four word lines (such as WL0–WL3); hence, there are in total 512 word lines.

Selection of each of the word lines (WL0–WL511) in FIG. 15 is performed as follows. For RF4–RF15, as explained above, depending on the predecoded address signal (A0–A7), among the four signals RF4–RF7, only one is set at level "1"; similarly among RF8–RF11, only one is set at level "1"; among RF12–RF15, only one is set at level "1"; and among RA8 and RA8, only one is set at level "1". On the other hand, along the four signals RXH0–RHX3 at booster circuit portion (4), only one is set at level "1"; hence, the total number of combinations is $128 \times 4 = 512$ (cases), and it is possible to select one out of 512 word lines (WL0–WL511).

As shown in FIG. 16, booster circuit (4) consists of four identical circuit blocks (4a) (the internal circuit of which will be explained later with reference to FIG. 12). Circuit blocks (4a) have said predecoded signals RF0–RF3 and signal RF21 from RAS clock generator (1) as their inputs, respectively. Circuit blocks (4a) output signals RXH0–RXH3, respectively. Signal RL21 connected to said booster circuit portion (4) is called a delayed function enable signal. Signal RL21 is used for determining the output timing of signals RXH0–RHX3. The time point determined by the output of said X decoder portion (5) (5a) is used as its timing.

In the following description, with reference to FIG. 12, an example of the internal circuits of word driving circuit portion (6), booster circuit portion (4) and X decoder portion (5) will be presented together with an explanation of their operation. In order to facilitate the explanation, FIG. 12 only depicts a part of the major configurations of the internal circuits.

With regard to X decoder portion (5) shown in FIG. 12, four N-channel MOS transistors Q2-Q5 are connected to each other with the drains of respective transistors being connected to the source of the adjacent transistor. The source of transistor Q5 is connected to ground $V_{SS}$. The drain of transistor Q2 is connected to the drain of P-channel MOS transistor Q1. In addition, the source of transistor Q1 is connected to power supply $V_{DD}$. The gate of transistor Q1 is connected to precharge signal PC. Gates of transistors Q2-Q5 are connected to said signal inputs RF4-RF15, RA8 and RA8, respectively (i.e., said transistors Q2-Q5 form said 4-input AND circuit 5a).

In addition, the drain of P-channel MOS transistor Q1 (or the drain of N-channel MOS transistor Q2) is connected to the drain of P-channel MOS transistor Q6 and the gates of P-channel MOS transistor Q7 and N-channel MOS transistors Q8 and Q11, respectively. The source of transistor Q6 and the source of transistor Q7 are connected to power supply $V_{DD}$, respectively. The source of transistor Q8 is connected to ground $V_{SS}$; the drains of transistors Q7 and Q8 are connected with each other; their drains are connected to the gate of transistor Q6 and the drain of N-channel MOS transistor Q9 in word line driving circuit portion (6) to be described later, respectively.

In FIG. 15, in order to facilitate explanation, the explanation is omitted for the portions corresponding to the circuit configurations of said transistors Q6, Q7, and Q8.

Now, with regard to word line driving circuit portion (6), the 2-input AND circuit (6a) is made of two N-channel MOS transistors Q10 and Q11. That is, the source of transistor Q10 and the drain of transistor Q11 are connected to each other; the drain of transistor Q10 is connected to outputs RXH0-RXH3 of booster circuit portion (4); the source of transistor Q11 is connected to ground VSS The gate of transistor Q9 is connected to power supply VDD; its source is connected to the gate of transistor Q10. The source of transistor Q10 (or the drain of transistor Q11) is connected to word lines WL0-WL511. The explanation is omitted for the portions corresponding to the circuit configurations of said transistor Q9 and Q10 in FIG. 15 to simplify the explanation.

Explanation will follow with regard to FIG. 12 for one circuit block (4a) of the booster circuit portion (4) in FIG. 16. Clock RL21 and RF0-RF3 are connected to the inputs of 2-input NAND gate (7). Its output is connected via inverter (8) to the drain of N-channel MOS transistor Q12, and via three inverters (9) (in this example, the 3 inverters form a delay circuit) and capacitor (Cl) to the drain of transistor Q10. Besides, the gate of transistor Q12 is connected to power supply $V_{DD}$, and its source is connected to the drain of transistor Q10.

In order to produce output clock signals RXH0-RXH3 in the booster circuit portion (4), node (D) is first charged to voltage $V_{DD}-V_T$, which is lower than the power supply voltage by $V_T$, the threshold voltage of N-channel MOS transistor Q12, with node (C) being at level "L". The voltage at node (D) is increased due to capacitive coupling via capacitor Cl with a time difference caused by inverters (9). RF0-RF3 and RL21 enable) play the role of controlling timing of word line driving circuit portion (6) to be explained later. They also play the role of a decoder by selecting one out of the said four word lines (one out of WL0-WL3 in the example shown in FIG. 15).

In the following, an example with specific values of voltage levels for the major operation process of FIG. 12 will be described. First, in the precharge state, the precharge signal PC at the input of the gate of P-channel MOS transistor Q1 becomes level "0"; the partially decoded row address signals (RF4-RF15, RA8, and RA8 in FIG. 14) set all the gates of N-channel MOS transistors (Q2)-(Q5) to level "0." Hence, transistors Q2-Q5 are all in the OFF state, and transistor Q1 is in the ON state, such that the voltage at the node (E) increases to 5 V ($V_{DD}$).

P-channel MOS transistor Q6 latches said node (E) at the 5 V state. Node (E) is kept at 5 V even when the precharge signal PC disappears (i.e., even when precharge signal PC becomes level "1" and transistor Q1 is turned OFF, transistor 6 is in the ON state due to the level "0" output of the inverter made of transistors Q7 and Q8; hence, node (E) is maintained at 5 V). In this case, nodes (F) and (G) are at 0 V ($V_{SS}$), and all of the word lines (WL0-WL511) are also at 0 V, since N-channel MOS transistor Q11 is in the ON state.

Then, when the operation state occurs, the partially decoded row address signals (RF4-RF15, RA8, and RA8) set level "1" for all the gates of transistors Q2-Q5; hence, they all turn to the ON state. Therefore, node (E) is charged to 5 V contrary to the above operation; furthermore, because of transistor Q9 (this transistor Q9 is always in the ON state because its gate is connected to the power supply voltage $V_{DD}$), the voltage at node (G) falls by the threshold voltage $V_T$(1 V) of transistor Q9 to be charged to 4 V. After charging is finished, transistor Q9 is turned OFF; hence, node (G) is in a floating state.

By raising one of RXH0-RXH3 from 0 V to 5 V, with node (G) being charged to 4 V, node (G) is so-called, self-booted (self step-up) by transistor Q10 to be charged to about 8 V. With regard to the said self-boot phenomenon, when node (G) is at 4 V, and RXH0-RXH3 as well as each word line (WL0-WL511) is at 0 V, transistor Q10 is ON; equivalently, node (G) may be regarded as being connected to RXH0-RXH3 and word lines (WL0-WL511) with a capacitor therebetween. The capacitor has a capacitance equal to the gate capacitance of transistor Q10 in the ON state. In this case, when one of RXH0-RXH3 is changed from 0 V to 5 V, the voltage at node (G) increases due to the capacitance of the said capacitor (the gate capacitance of transistor Q10). Ideally, it should be increased by 5 V. However, in the actual situation, due to the charge share with the self-capacitance of node (G) (wire capacitance of node (G), the capacitance of diffusion layer of transistor Q6, etc.), the voltage increase cannot reach 5 V and is usually about 3-4 V.

As explained above, as node (G) is boosted to a voltage of about 8 V, the 5 V voltage can be transmitted from RXH0-RXH3 to the word line (for example, WL0) with the aid of transistor Q10. When data are refreshed (rewritten) in the dynamic RAM, word line boosting circuit portion (4) boosts RXH0-RXH3 from 5 V to 8 V, and boosts node (G) to about 12 V; hence, the worked line (for example, WL0) is further charged to 8 V. Besides, as explained above, in X decoder portion (5) in FIG. 14, each decoder is connected to four word lines (such as, WL0-WL3). Among these lines, only one (for example, WL0) is finally selected through word line driving circuit portion (4) (see FIGS. 14-16).

Now, with reference to FIGS. 13 and 14, described below is the major operation before a high-voltage output $V_{PP}$ (for example, 8 V) from booster circuit portion (4) is output to the word line selected by the input signal of the RAS system shown in FIG. 14 as described above.

First, with RAS being at level "0" at time t1, signal RL21 which is provided by RAS clock generator (1) becomes level "1" at time t2 and is entered into address buffer (2). Due to signal RL21, at time t3, row address inputs A0-A8 are taken into address buffer (2); at the same time, output signals RA0, RA0-RA7, and RA7 from address buffer (2) are taken into predecoder (3); and RA8 and RA8 are each taken into X decoder portion (5).

Then at time t4, signals RF0-RF3 predecoded at predecoder (3) ar taken into booster circuit portion (4), while RF4-RF15 are taken into X decoder portion (5). At time t5, output signals RXH0-RXH3 from booster circuit portion (4) and signals RF4-RF15, RA8, and RA8 input into the X decoder (5) select, as described above, a work line (for example, WL0) which acquires a high-voltage output $V_{PP}$ (for example, 8 V) at time t6 through work line driving circuit portion (6).

As explained above, in the dynamic RAM, X decoder portion (5), word line driving circuit portion (6), and booster circuit portion (4) form the driving circuit. As explained above with reference in FIG. 12, in the work line driving circuit portion (6) within the said driving circuit, because N-channel MOS transistor Q10 has to transfer the levels (voltages) of RXH0-RXH3 by self-boot operation, the timing of the operation of node (E) and RXH0-RXH3 must be controlled. That is, the signals must be controlled to ensure the following relationship: after node (E) reaches level "0" (0 V) and node (G) reaches $V_{DD}-V_T$ (about 4 V) which is lower than the power supply voltage by threshold voltage $V_T$ of transistor Q9, RXH0-RXH3 rise. In this case, the necessity for performing timing control (or, control of sequence) in the said self-boot (self-step-up) operation is as follows: when the voltages at nodes (F) and (G) are lower than $V_{DD}-V_T$, i.e., $V_{DD}-V_T > V_F$ (voltage of node (F)), a prescribed voltage (for example, 5 V) enters transistor Q10 due to RXH0-RXH3; an attempt to raise node (G) by coupling of the gate capacitance of transistor Q9 only results in the electric charge escaping to node (F) through the channel of transistor Q9.

As explained above, if signals RXH0-RXH3 are not raised in a timing after transistor Q9 is pinched off (i.e., the state in which the charge cannot leak from node (G) to (F) with the voltage of node (G) being $V_{DD}-V_T$ (about 4 V), the self-boot operation due to the gate capacitance of transistor Q10 could not be performed. As explained above with reference to FIGS. 13 and 14, because the timing of output signals RXH0-RXH3 from word line driving circuit portion (4) has to be controlled sequentially according to row address inputs (A0-A8) taken due to signals of RAS and RL21, to provide a high-voltage output $V_{PP}$ (for example, 8 V) to the selected word line (for example, WL0) takes a very long time. Actually, as shown in FIG. 17, after row address input (A0-A8) is taken, it takes about 13 ns before one of the word lines (WL0-WL511) reaches 5 V. (As a matter of fact, if the margin of the power supply voltage $V_{DD}$ and the temperature margin are taken into consideration, a longer time will be needed. This is a serious problem in realizing high-speed operation of a dynamic RAM, etc.

The purpose of this invention is to provide a type of driving circuit that can output driving signals with a predetermined voltage in a short time to output lines, such as word lines or the like, in a dynamic RAM.

SUMMARY OF THE INVENTION

This invention provides a type of driving circuit comprising: an operation signal supply circuit portion for receiving an input signal to provide an operation signal, a driving signal output circuit portion which receives the operation signal and outputs a driving signal to the output line, and a voltage supply circuit portion which provides a predetermined voltage to the driving signal output circuit portion to form the driving signal, wherein a bipolar switching element is provided on the voltage supply circuit portion side of the driving signal output circuit portion, and the operation signal activates the bipolar switching element so that the predetermined voltage of the voltage supply circuit portion is output as the driving signal to the output line.

BRIEF DESCRIPTION OF THE DRAWINGS

FIG. 1 is an equivalent circuit diagram showing an embodiment in which this invention is applied to a dynamic RAM.

FIG. 2 is a timing chart illustrating the major operations in FIG. 1 and in FIG. 3, to be described later.

FIG. 3 is a schematic block diagram illustrating the major configuration of a dynamic RAM to which the embodiment shown in FIG. 1 is applied.

FIG. 4 is an equivalent circuit diagram of the logic gates for illustrating the connection relation of actual X decoder portion (25), word line driving circuit portion (26) and booster circuit portion (24).

FIG. 5 shows the actual voltage-time characteristic in the embodiment shown in FIG. 1.

FIG. 6 is a cross-sectional diagram illustrating the major device configuration in FIG. 1 (cross-sectional diagram of FIG. 7 cut along the VI—VI line).

FIG. 7 is a plan view of FIG. 6.

FIG. 8 is an equivalent circuit diagram illustrating another embodiment of this invention.

FIG. 9 is an equivalent circuit diagram illustrating another embodiment of this invention.

FIG. 10 is an equivalent circuit diagram illustrating another embodiment of this invention.

FIG. 11 is an equivalent circuit diagram illustrating yet another embodiment of this invention.

FIG. 12 is an equivalent circuit diagram illustrating a conventional driving circuit.

FIG. 13 is a timing chart illustrating the major operations in FIGS. 12 and 14.

FIG. 14 is a schematic block diagram illustrating the main configuration of the dynamic RAM to which the driving circuit shown in FIG. 12 is applied.

FIG. 15 is an equivalent circuit diagram of the logic gates illustrating the connection relation of X decoder (5), word line driving circuit portion (6) and booster circuit portion (4) in FIG. 12.

FIG. 16 is a schematic block diagram illustrating the connection relation of the circuit configuration of booster circuit portion (4) in FIG. 12.

FIG. 17 shows the actual voltage-time characteristic in the embodiment shown in FIG. 12.

Figure 1:
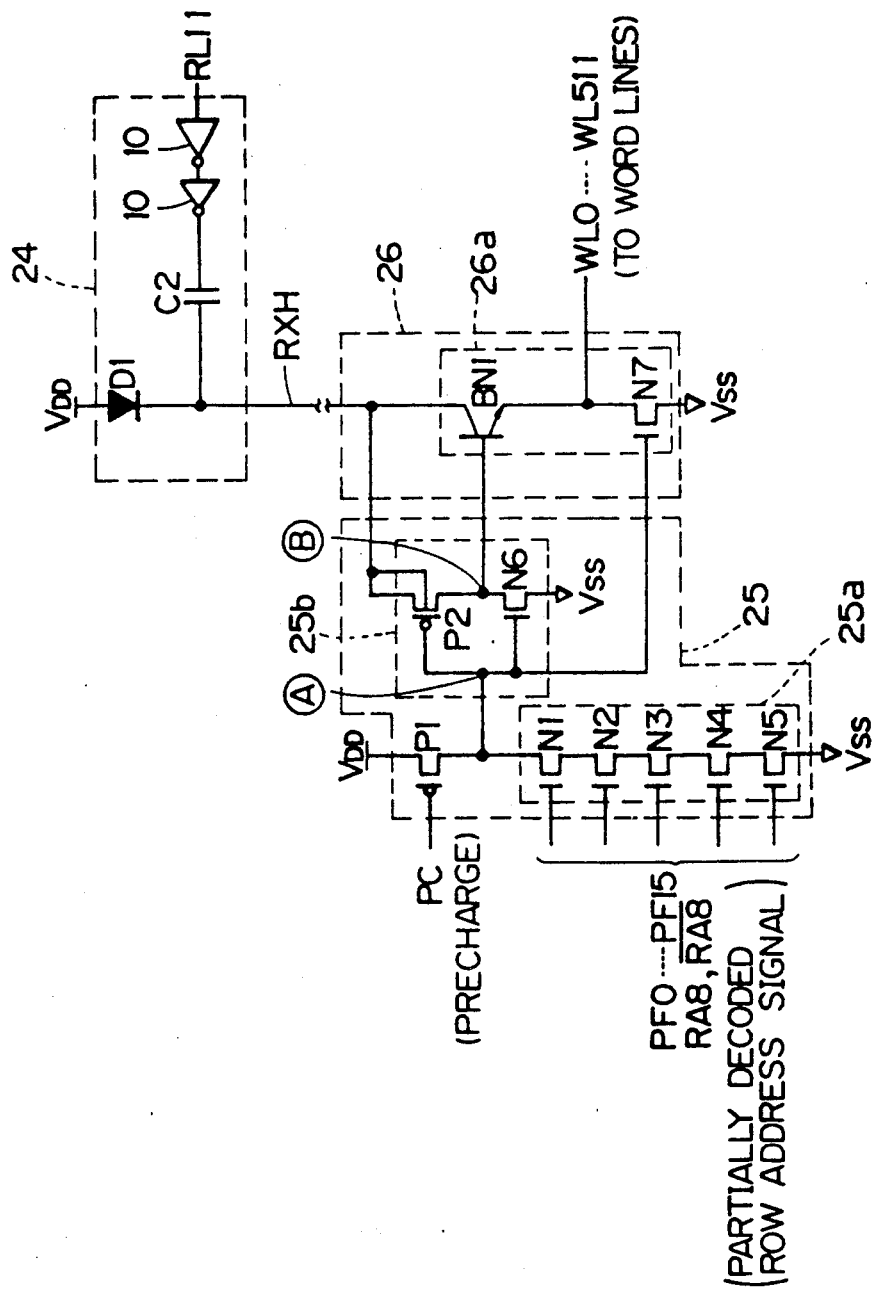
FIGS. 1-11 illustrate embodiments of this invention.

The reference numerals used in the figures are as follows:

1 . . . RAS clock generator;
2 . . . Address buffer;

3 ... Predecoder;
4. 25 ... Booster circuit portion (voltage supply circuit portion);
5, 25 ... X decoder portion (operation signal supply circuit portion;
6, 26 ... Word line driving circuit portion (driving signal output circuit portion);
N1, N2, N3, N4, N5, N6, N7, N8, Q2, Q3, Q4, Q5, Q8, Q9, Q10, Q11, Q12 ... N-channel MOS transistors;
P1, P2, P3, Q1, Q6, Q7 ... P-channel MOS transistors;
BN1 ... NPN bipolar transistor;
BP1 ... PNP bipolar transistor;
A0, A1, A2, A3, A4, A5, A6, A7, A8 ... Address input;
WL0-WL511 ... Word lines;
RXH, RXH0, RXHI, RXH2, RXH3 ... Predetermined voltage output signal;
$V_{PP}$ ... High-voltage output;
$V_{DD}$ ... Power supply side; and
$V_{SS}$ ... Ground side.

DESCRIPTION OF THE PREFERRED EMBODIMENTS

In the following, this invention will be explained with reference to the embodiments.

FIGS. 1-7 illustrate an example of this invention applied to a 1 M dynamic RAM. Like reference characters are used for like and corresponding parts, and an explanation of which may be omitted.

Figure 3:
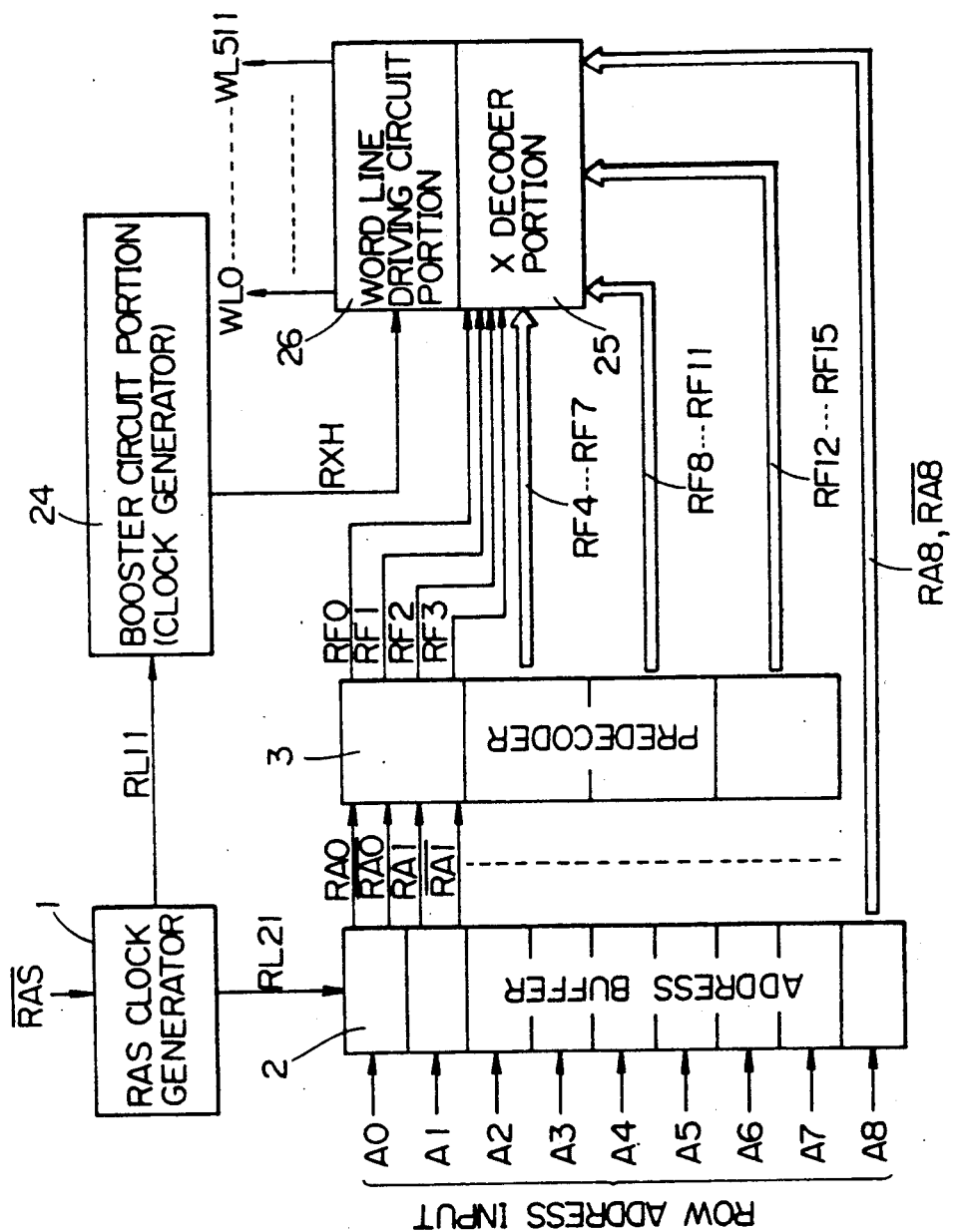
Figure 14:
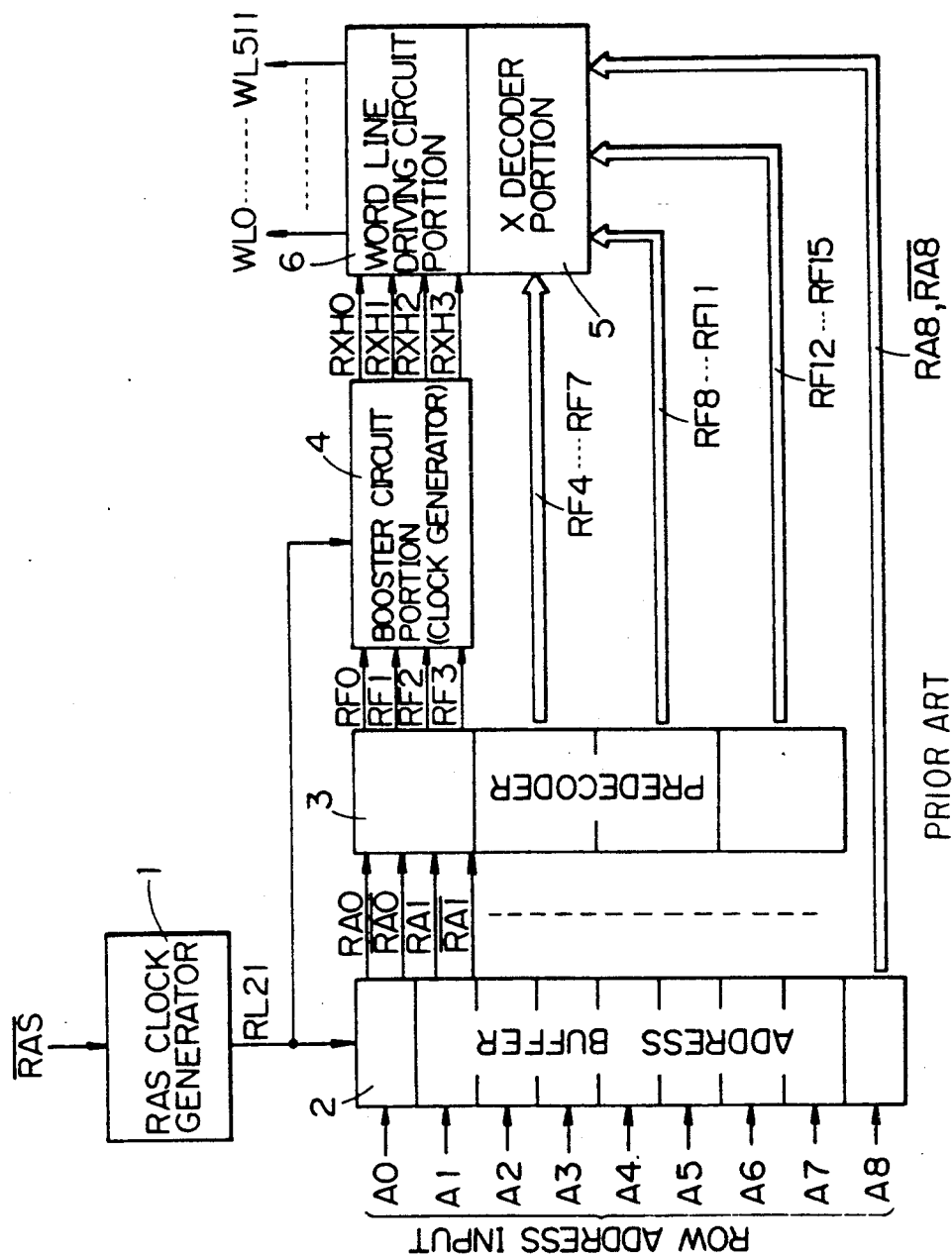
Figure 15:
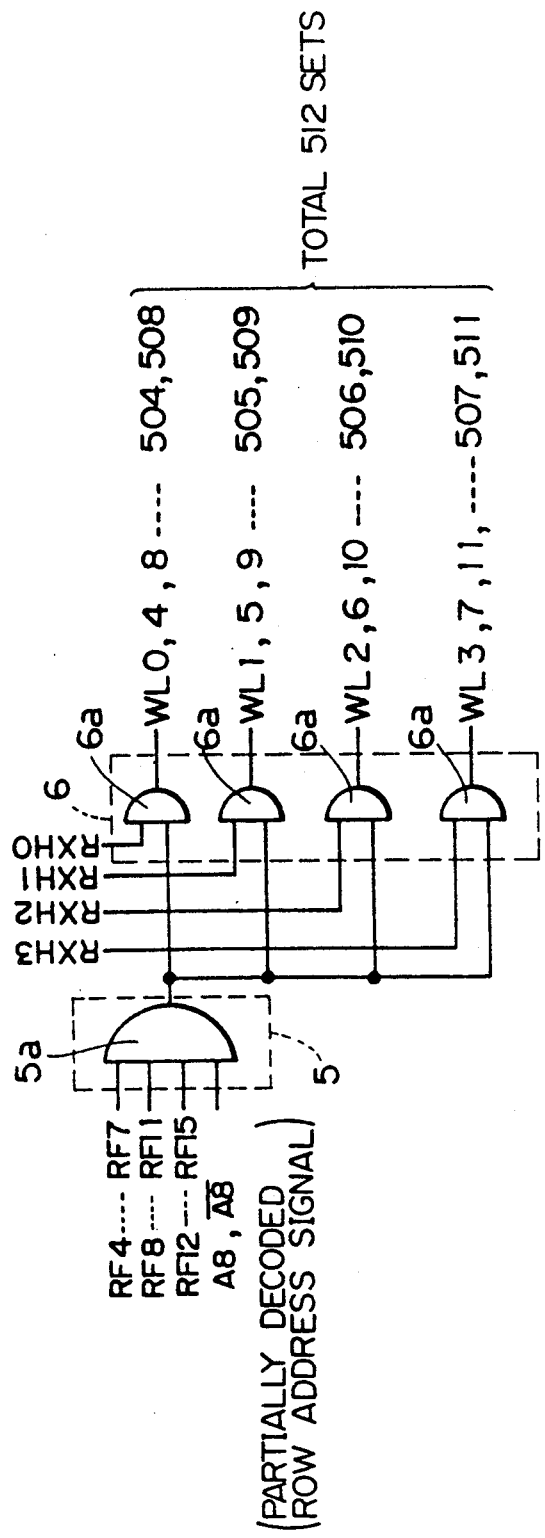
Figure 16:
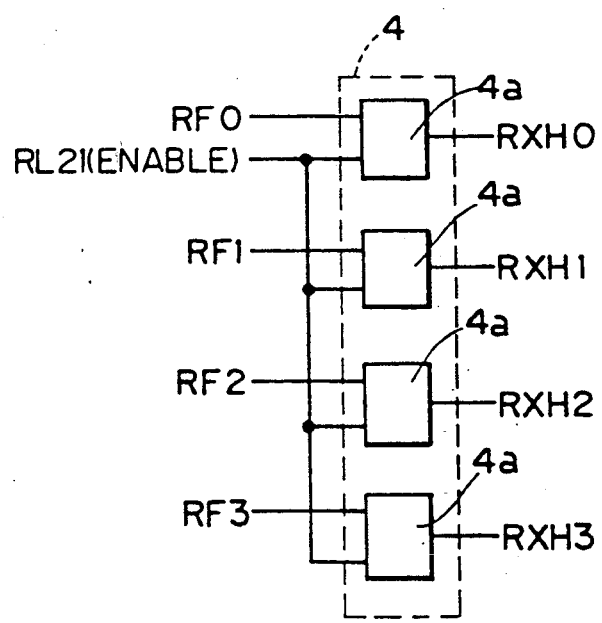
Figure 17:
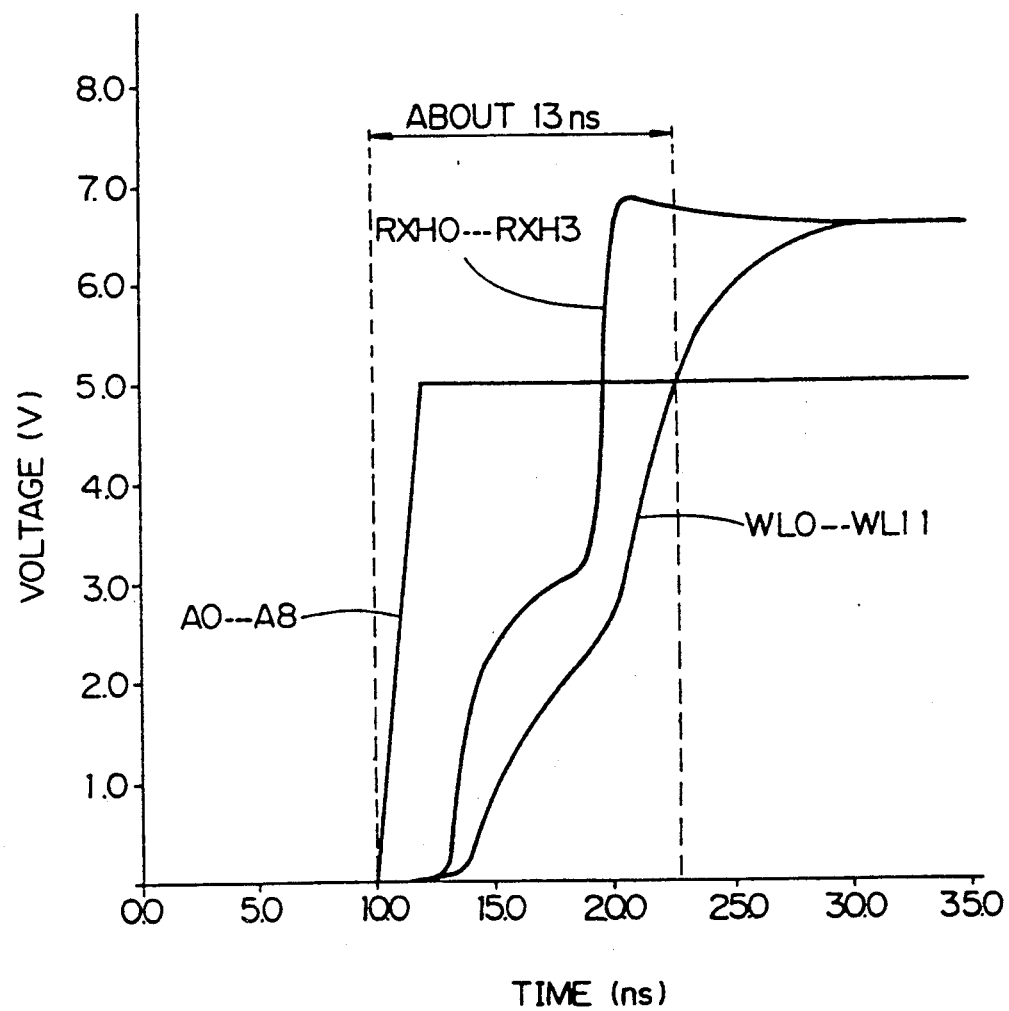

FIG. 3 is a schematic block diagram illustrating the structure from RAS to the word lines (such as the 512 lines of WL0-WL511). The structure is roughly identical to the example illustrated in FIG. 14. The difference is that output signals RF0-RF3 from predecoder (3) are each connected to X-decoder portion (25); a signal RL11 generated by RAS clock generator (1) in addition to RL21 is connected to booster circuit portion (24); and the output signal RXH is connected to word line driving circuit portion (26).

Figure 4:
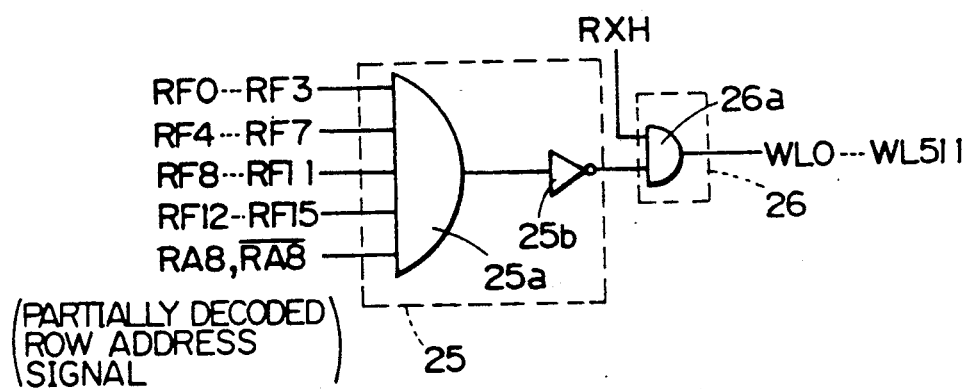

FIG. 4 illustrates the wiring relation between word line driving circuit portion (26) and X decoder portion (25). Their operations can be explained as follows. As shown in FIG. 4, X decoder portion (25) comprises a 5-input AND circuit (25a) and an inverter (25b); word line driving circuit portion (26) comprises a 2-input AND circuit (26a). The output of the inverter (25b) in the X decoder portion (25) is connected to one of the two inputs of the 2-input AND gate (26a) in word line driving circuit portion (26). The output signal RXH from the booster circuit portion (24) is connected to the other input of the AND circuit. The output of the 2-input AND circuit (26a) is connected to one of the various word lines (WL0-WL511).

That is, there are a total of 512 circuits comprising the 5-input AND circuit (25a), the inverter (25b) and the 2-input AND circuit (26a) with 4×4×4×4×2=512 combinations of the inputs RF0-RF3, RF4-RF7, RF8-RF11, RF12-RF15, RA8, and RA8 entered into the 5-input AND circuit (25a). Each of the 512 circuits is connected to one word line in the configuration. The operation is similar to the selection of each word line (WL0-WL511) by the X decoder portion (5) in the aforementioned example. In this case, however, as will be explained later, each word line (WL0-WL511) is structured only to be selected by output signals RF0-RF15, RA8, and RA8 from predecoder (3) in FIG. 3.

FIG. 1 shows a specific example of the internal circuits of word line driving circuit portion (26), booster circuit portion (24), and X decoder portion (25) to illustrate the operation.

Figure 12:
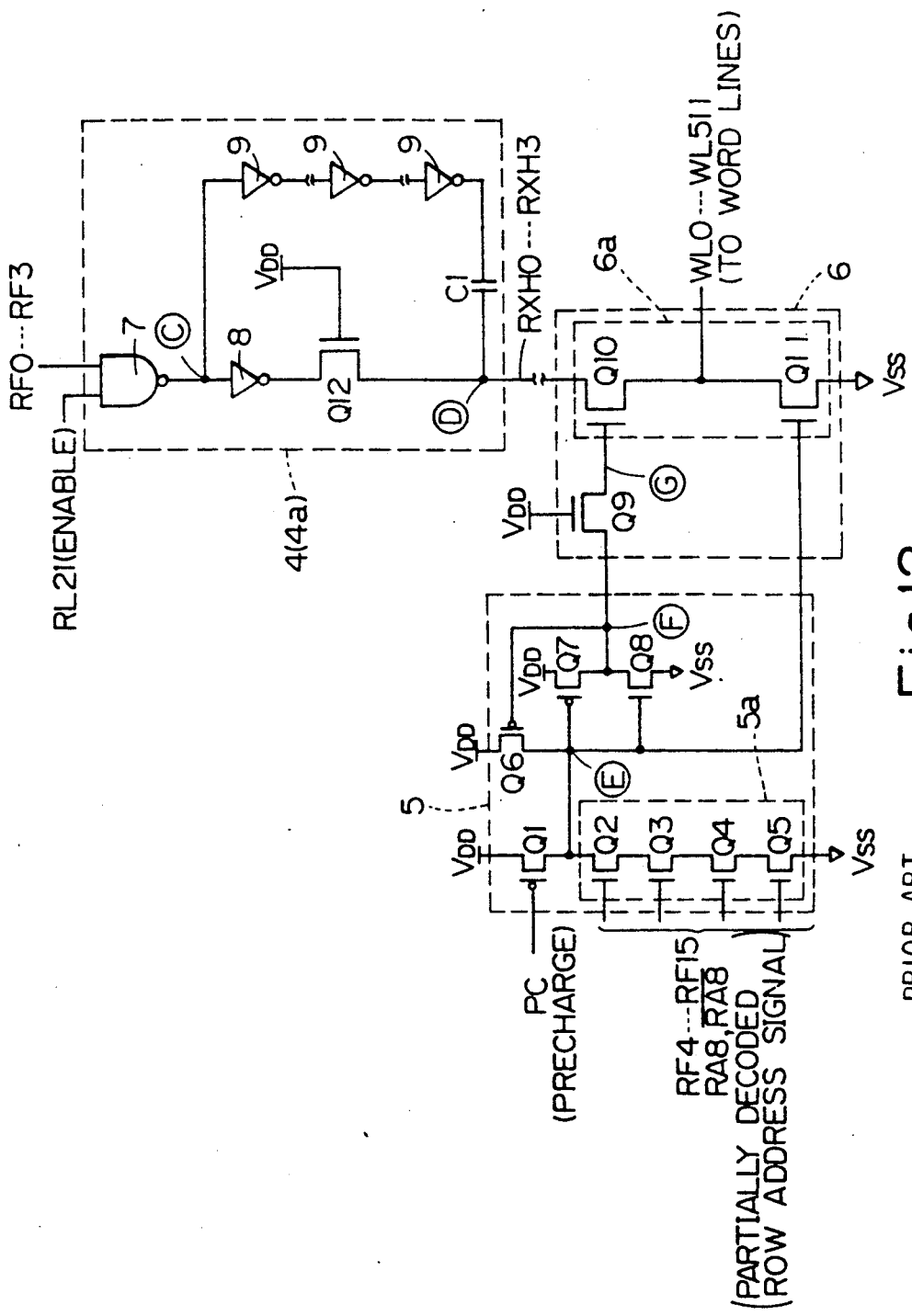
FIGS. 12-17 illustrate a conventional embodiment.

First, with regard to X decoder portion (25) shown in FIG. 1, the circuit configuration is similar to that in the example shown in FIG. 12. That is, P-channel MOS transistors P1 and P2 in this case correspond to P-channel MOS transistors Q1 and Q7 in FIG. 12; N-channel MOS transistors N2-N5 and N6 correspond to N-channel MOS transistors Q2-Q5 and Q8 in FIG. 12, respectively. With regard to differences therefrom, N-channel MOS transistor N1 is connected between P-channel MOS transistor P1 and N-channel MOS transistor N2; the substrate (N-well (13) to be described later) of P-channel MOS transistor P2 is connected to its source, and they are further connected to output signal RXH of booster circuit portion (24). In this example, there is no transistor corresponding to P-channel MOS transistor Q6 shown in FIG. 12. Hence, as explained above, in X decoder portion (25), transistors N1-N5 form 5-input AND circuit (25a) shown in FIG. 4; transistors P2 and N6 form inverter circuit (25b) shown in FIG. 4.

Now, with regard to word line driving circuit portion (26), compared to the example shown in FIG. 12, N-channel MOS transistor N7 corresponds to transistor Q11 in FIG. 12; NPN bipolar transistor BNI corresponds to transistor Q10 shown in FIG. 12. However, in this example, there is no transistor corresponding to transistor Q9 in FIG. 12. As to the connection of each element, the base of HPN bipolar transistor BN1 is connected to the drains of P-channel MOS transistor P2 and N-channel MOS transistor N6; the collector of transistor BN1 is connected to the source of P-channel MOS transistor P2 and output signal RXH from booster circuit portion (24); and the emitter of transistor BN1 is connected to word lines (WL1-WL511) and the drain of N-channel MOS transistor N7. Hence, as explained above, in word line driving circuit portion (26), NPN bipolar transistor BN1 forms 2-input AND circuit (26a) shown in FIG. 4. This NPN bipolar transistor BN1 and N-channel MOS transistor N7 connected to the ground side $V_{SS}$ form the basic circuit structure thereof.

Now, with regard to the most basic configuration of booster circuit portion (24), signal RL11 generated by RAS clock generator (1) in FIG. 3 is connected to the cathode of diode D1 via two inverters (10) and capacitor (C2) for boosting; the anode of diode D1 is connected to power supply voltage $V_{DD}$; its cathode outputs output signal RXH. The operation of this portion is as follows: as shown in FIG. 3, when RAS becomes level "1," RXH becomes $V_{DD}-V_{D1}$ (the level after the drop of the voltage by a single stage of diode D1: about $V_{DD}-0.7$ V). When RAS falls (to level "0"), RL11 becomes level "1," and due to boosting capacitor C2, output RXH is boosted to $V_{PP}$ (about 8 V when $V_{DD}$ equals 5 V). Until RL11 becomes level "1" and boosting is performed due to capacitor C2, RXH remains at the level of $V_{DD}-V_{D1}$) and does not become level "0."

The overall basic operation of the circuit configuration shown in FIG. 1 is similar to that in the example shown in FIG. 12. The difference is the following: if node (A) is at level "0," the level of RXH is transmitted directly to node (B) through P-channel MOS transistor P2; thus, at that time, the predetermined voltage (for example, $V_{PP}-V_{BE}$) when the base-emitter voltage of transistor BN1 is $V_{BE}$) can be transmitted to a selected word line (for example, WL0) by output signal RXH of booster circuit portion (24) through NPN bipolar transistor BN1.

In the following, with reference to FIG. 2, the major operations of providing a high-voltage output ($V_{PP}-V_{BE}$) from booster circuit (24) to the word line selected by the above RAS signal input in FIG. 3 will be described.

Figure 2:
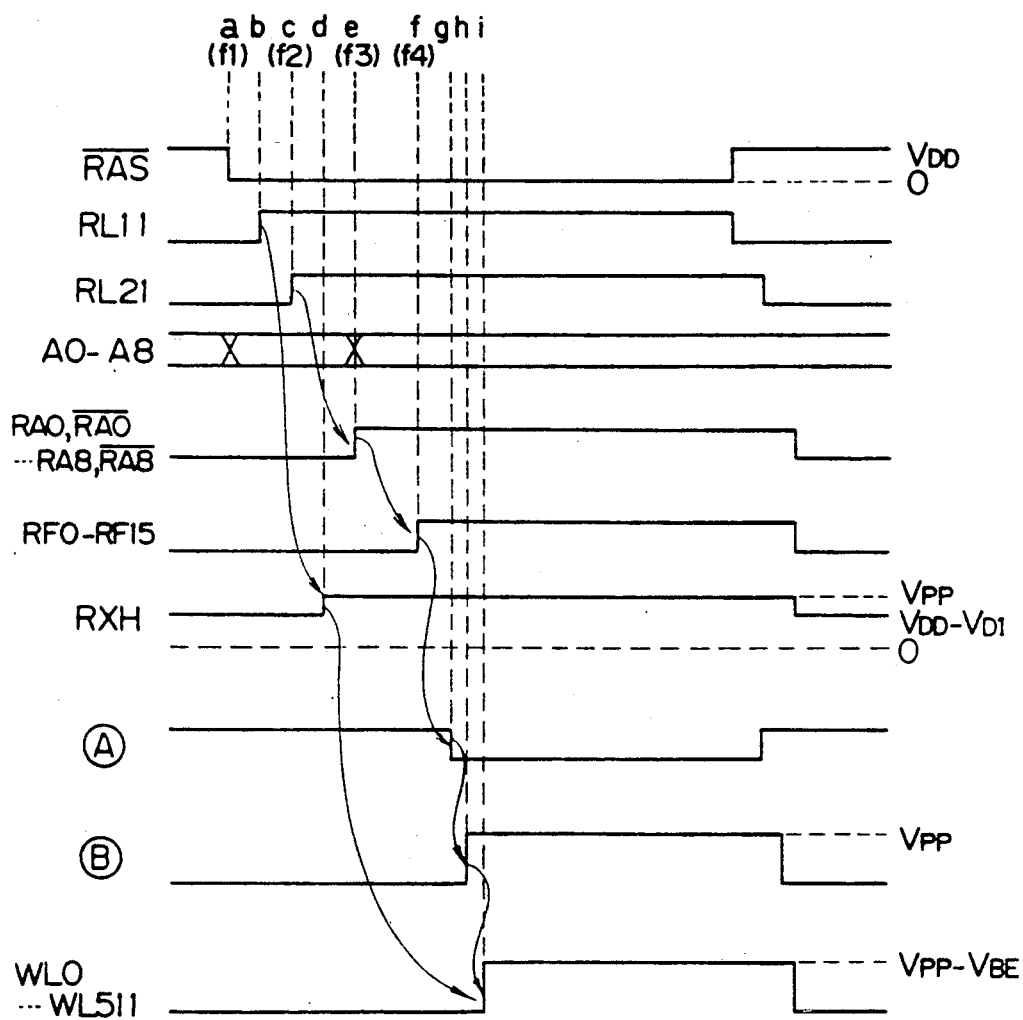
Figure 13:
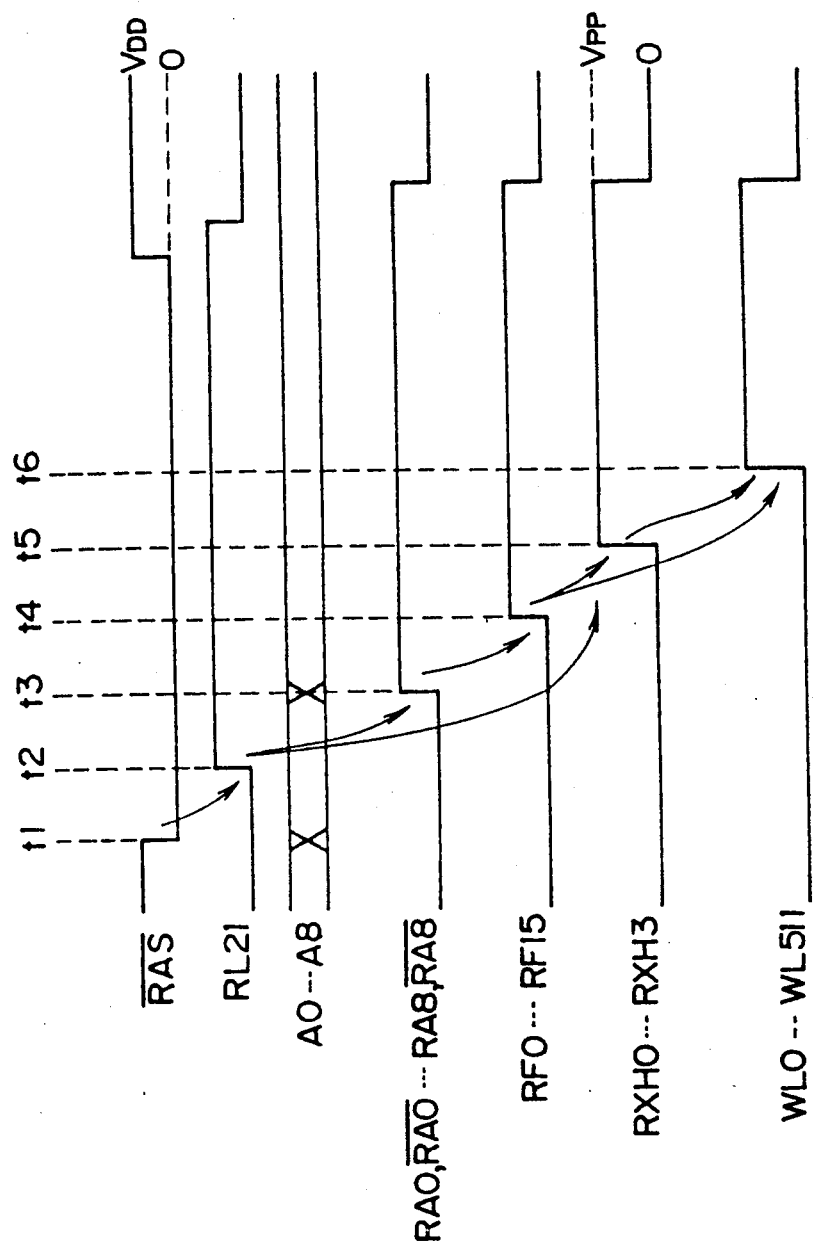

First of all, the major operations at time points a-f in FIG. 2 are similar to the operations at time points $t_1$-$t_4$ as explained above with respect to FIG. 13. (That is, time points a, c, e, and f in this case correspond to time points $t_1$, $t_2$, $t_3$, and $t_4$ in FIG. 13, respectively.) The differences are that at time point b, signal RL11 becomes level "1" ($V_{DD}$), and at a later time point d, signal RXH becomes $V_{PP}$ (for example, 8 V).

At time point g, node (A) shown in FIG. 1 becomes level "0" ($V_{SS}$). At a later time point h, the voltage at node (B) is raised to $V_{PP}$. Then, immediately at time point i, as explained above, the selected word line (for example, WL0) is charged to ($V_{PP}-V_{BE}$) by signal RXH through NPN bipolar transistor BN1.

As explained above, in this example, the driving circuit comprises X-decoder portion (25), word line driving circuit portion (26) which receives the output signal of X decoder (25) to output a driving signal (such as $V_{PP}-V_{BE}$ in this example) to the selected word line, and a booster circuit portion (24) which provides a predetermined voltage (such as $V_{PP}$(8 V)) to word line driving circuit portion (26) to form the driving signal; an NPN bipolar transistor BN1 is set on the booster circuit portion (24) side of the word line driving circuit portion (26); this NPN bipolar transistor BN1 is operated by the output signal of the X decoder portion (25) and outputs the predetermined voltage of the booster circuit portion (24) to the word line as the driving signal. As a result, there is no need to perform the self-boot (self-step-up) operation in word line driving circuit portion (6) as required for the conventional driving circuit shown in FIG. 12.

Consequently, there is no need to provide for control of the timing for performing the self-boot (self-step-up) operation. (That is, in this example, as explained above, in the stage in which signal RL11 enters the booster circuit portion (24), due to the output signal RXH of booster circuit portion (24), the base of NPN bipolar transistor BN1 may be maintained at a high voltage $V_{PP}$.) As a result, as explained above, there is no need to control the timing of X decoder portion (25) and word line driving circuit portion (26) for forming signal RXH at booster circuit portion (24) and operating X decoder portion (25). (As explained above, X decoder portion (25) is sequentially controlled by RAS (RL21) and row address input A0-A8) in a parallel way (i.e., performing this operation separately). As a result, the time needed to control the timing can be shortened; thus, the predetermined voltage can be output to the selected word line (for example, WL0) in a short time.

Figure 5:
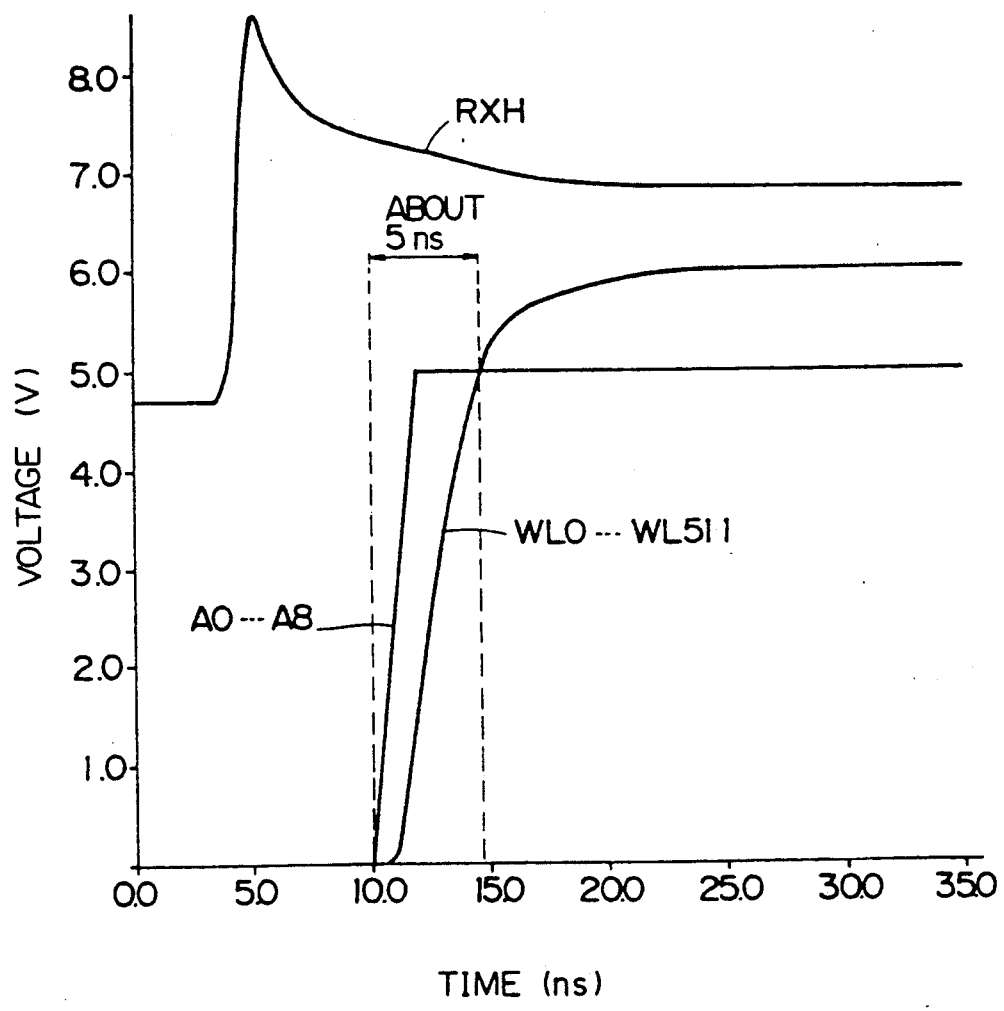

As shown in FIG. 5, in the actual operation, after row address input A0-A8 is taken into address buffer (2) by signal RL21, in a very short time of about 5 ns, the selected word line (for example, WL0) can be raised to 5 V. On the other hand, as pointed out above, in the conventional example, about 13 ns is needed to raise the selected word line (for example, WL0) to the same voltage of 5 V.

Besides, as explained above, in this example, an NPN bipolar transistor BN1 is set on the booster circuit portion (24) side of word line driving circuit portion (26) (in this example, between word line and booster circuit portion (24)); hence, the high-speed operation ability of NPN bipolar transistor BN1 itself is very favorable for the said advantages.

In addition, in this example, there is no need to have extra circuit components for controlling the fixing of output signal RXH in booster circuit portion (24) as in conventional booster circuit portion (4) shown in FIG. 12; hence, the circuit configuration can be simpler than the conventional one.

Figure 6:
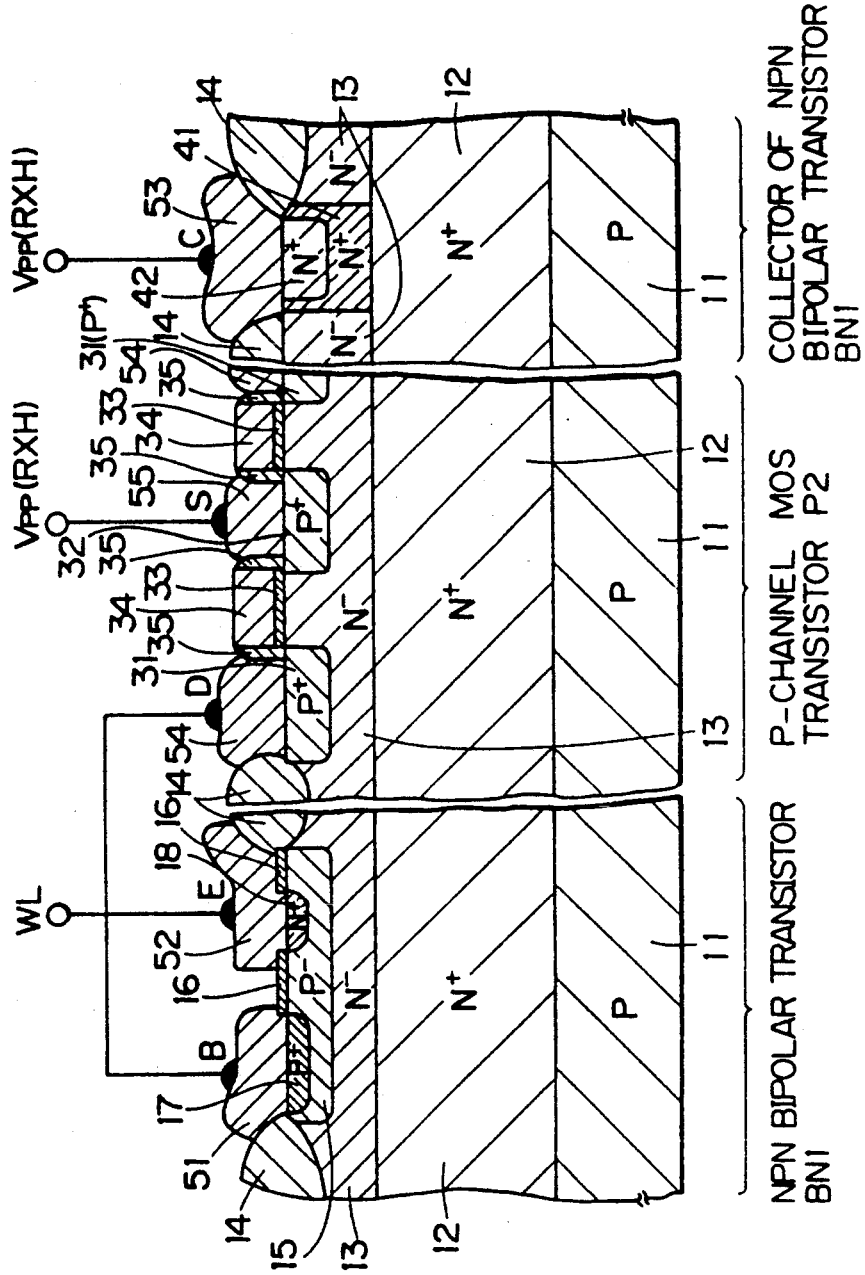

FIG. 6 shows an example of the device structure of NPN bipolar transistor BN1, P-channel MOS transistor P2, etc., shown in FIG. 1.

First of all, with regard to NPN bipolar transistor BN1, an $N^-$-type diffusion layer (N-well) (13) is formed over a surface of a P-type silicon substrate (11) with an $N^+$-type buried layer therebetween. A $P^-$-type base region (15) is formed in this $N^-$-type diffusion layer (13). In $P^-$-type base region (15), a $P^+$-type base electrode contact region (17) and an $N^+$-type emitter region (18) are formed by diffusion, respectively. On a portion of $N^+$-type buried layer (12) where above each region is not formed, an $N^+$-type diffusion region (41) is formed; furthermore, an $N^+$-type collector electrode contact region (42) is formed therein. Hence, for the NPN-type vertical bipolar transistor BN1, $N^+$-type collector contact region (42) and $P^-$-type base region (15) are connected with each other via $N^-$-type diffusion region (13), $N^+$-type buried layer (12), and $N^+$-type diffusion region (41).

Besides, in this figure, (14) is a field oxide film, (16) is an oxide film, (51) is a base electrode, (52) is an emitter electrode, and (53) is a collector electrode.

Figure 7:
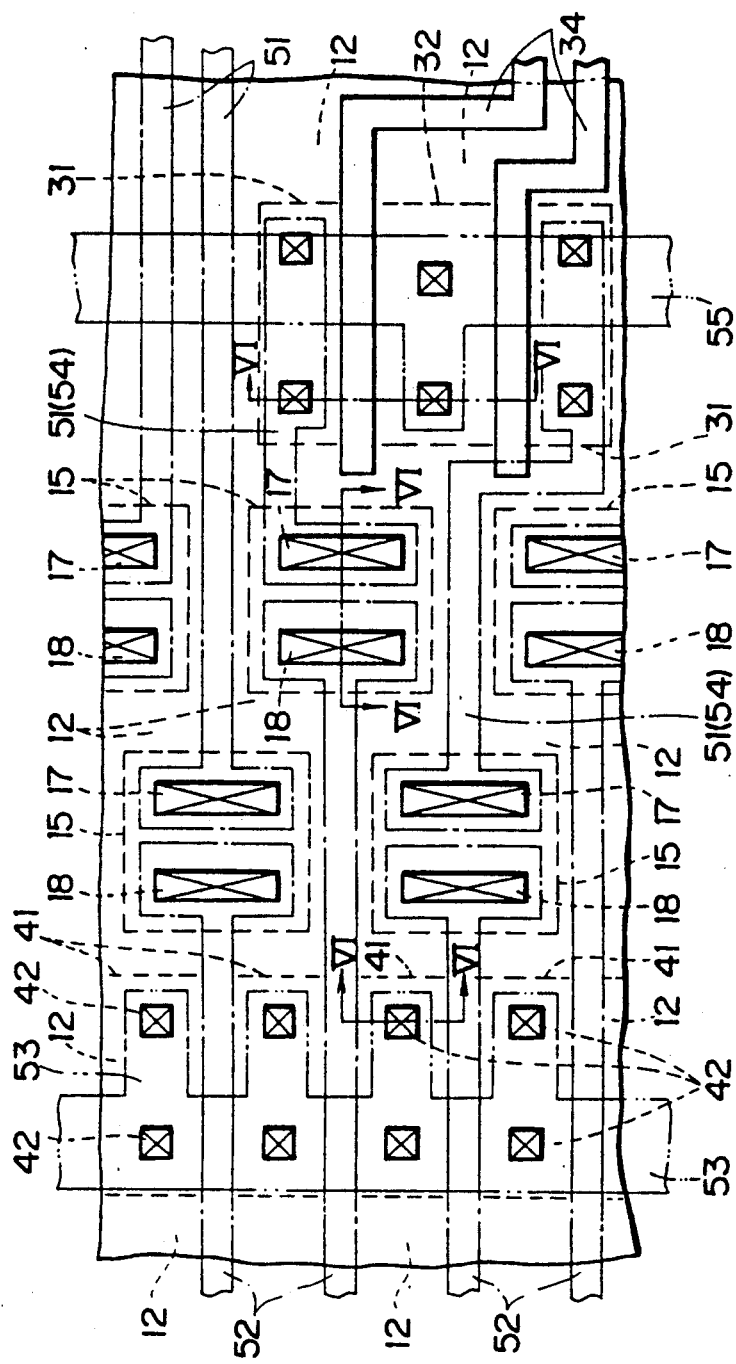

Now, with regard to P-channel MOS transistor P2, on the surface of $N^-$-type diffusion layer (13), a $P^+$-type drain region (31) and a $P^+$-type source region (32) are formed with predetermined patterns, between which a gate electrode (34) is formed with a gate oxide film (33) therebetween to form the P-channel MOS transistor P2. In this figure, (54) is a drain electrode, and (55) is a source electrode. FIG. 7 is a plan view of FIG. 6. FIG. 6 is a cross-sectional view of FIG. 7 cut along the VI—VI line.

As explained above, in this example, $N^+$-type buried layer (12) and $N^-$-type diffusion layer (N-well) (13) are used as the collector region of NPN bipolar transistor BN1. In addition, the common $N^-$-type diffusion layer (N-well) (13) is used to form the P-channel MOS transistor P2 with the so-called bi-MOS technique (a combination of the bipolar technique and the MOS technique). As a result, because of the device structure, the area occupied by elements is smaller than that occupied by the conventional circuit configuration of simple MOS transistors shown in FIG. 12. This is very advantageous for minimizing devices.

Figure 8:
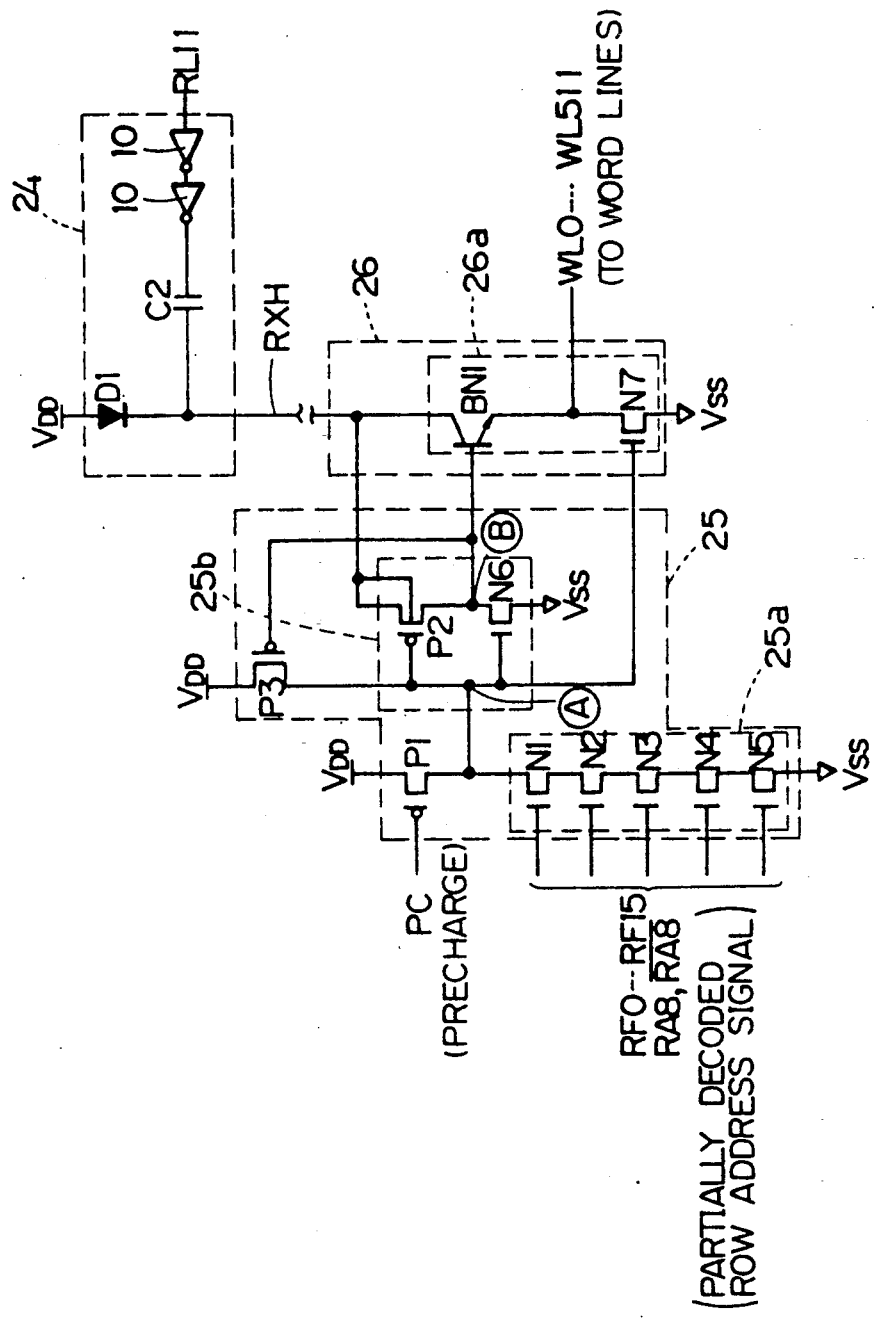

FIG. 8 illustrates another example of this invention. The basic circuit configuration is similar to that of the example shown in FIG. 1; hence, the explanation will be omitted for the identical portions. The difference is that P-channel MOS transistor P3 corresponding to P-channel MOS transistor Q6 in FIG. 12 is located between node (A) and made (B). That is, the source of P-channel MOS transistor P3 is connected to the power supply voltage $V_{DD}$; its drain is connected to the gates of P-channel MOS transistor P2 and N-channel MOS transistor N6; and the gate of this transistor P3 is connected to the drains of P-channel MOS transistor P2 and N-channel MOS transistor N6.

As explained above, in this example, even though there is no precharge signal PC as in the example shown in FIG. 12, node (A) can still be kept at $V_{DD}$ (for example, 5 V), which is favorable for the stable operation of the circuit.

Figure 9:
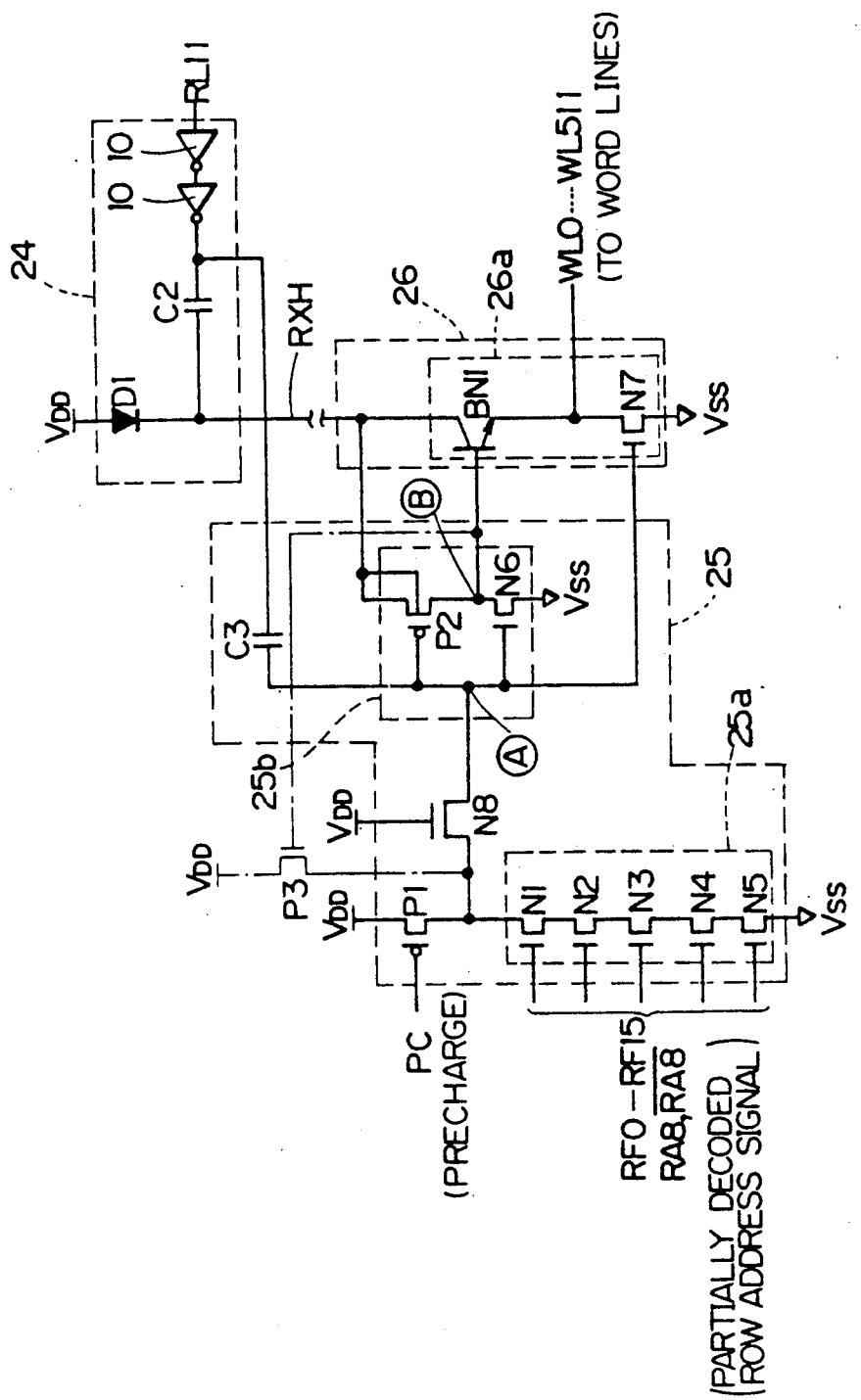

FIG. 9 shows yet another example of this invention. Instead of P-channel MOS transistor P3 in FIG. 8, N-channel MOS transistor N8 is used in this example, with its gate connected to power supply voltage $V_{DD}$, its drain connected to the drain of P-channel MOS transistor P1, and its source connected to node (A). Transistor N8 is used for isolation and is turned off when the source voltage becomes $V_{DD}-V_T$. At this time, the drain and source are isolated (floating state), and the voltage at node (A) can be maintained.

Besides, in this example, a capacitor C3 is connected between node (A) and the output of two inverters (10) in booster circuit portion (24). That is, in the unselected state, with the signal RXH being increased to $(V_{DD}+V_T)$ and above, and with node (A) being in the state of $V_{DD}$ (actually, $V_{DD}-V_T$ in this example), P-channel MOS transistor P2 will be turned ON which causes an error operation as the predetermined voltage is provided to a word line which is not selected); however, by providing the capacitor C3, in the unselected state, signal RL11 boosts the gate voltage (to $V_{DD}+V_T$ and above) of P-channel MOS transistor P2, so that transistor P2 cannot be turned ON. Besides, as shown by the broken lines in FIG. 9, a P-channel MOS transistor P3 may also be provided as in the example shown in FIG. 8.

As explained above, this example has the same advantages as the preceding examples, and is thus advantageous for improving the reliability of circuit operation.

Figure 10:
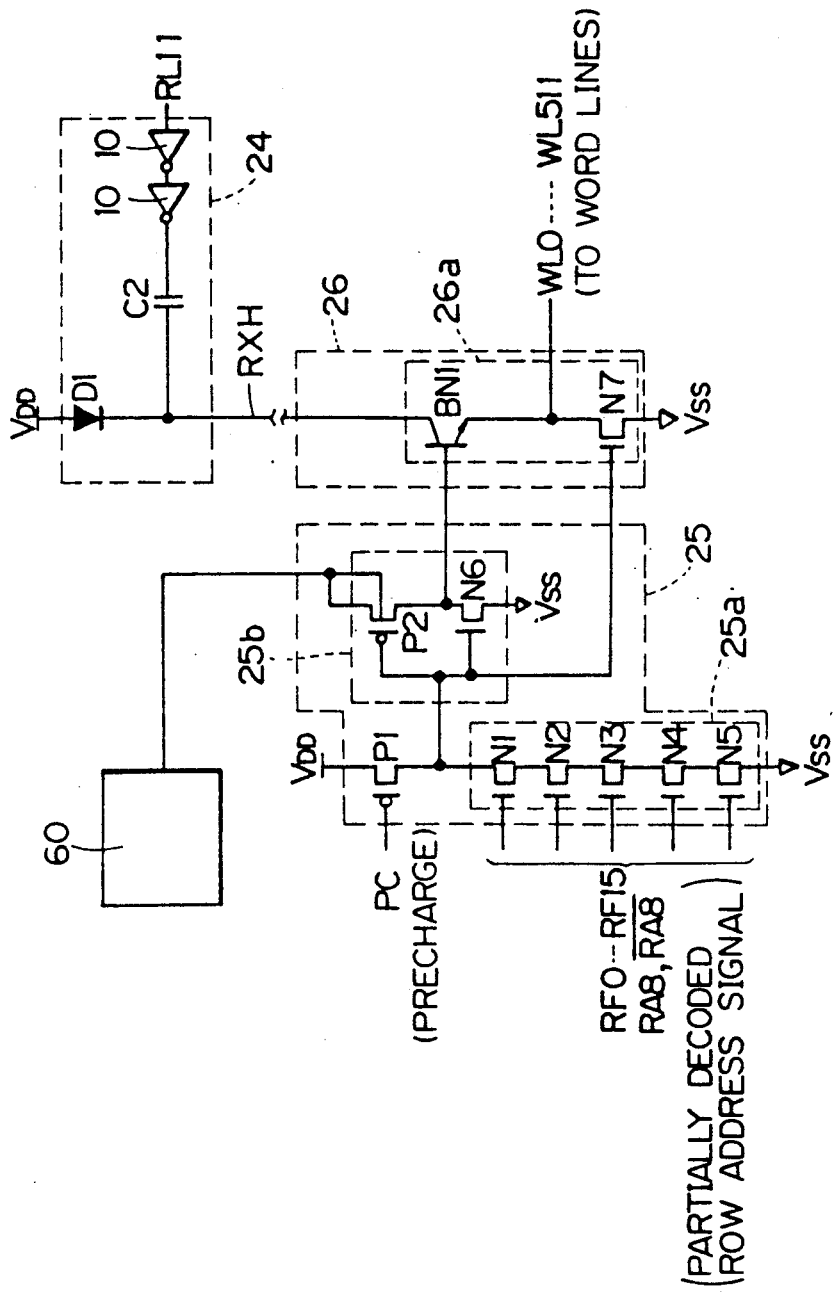

FIG. 10 shows yet another application example of this invention. The basic circuit configuration is similar to that of the preceding examples, and the explanation of the same portions will be omitted. The difference is that the source of P-channel MOS transistor P2 is not connected to output signal RXH of booster circuit portion (24); instead, another booster circuit portion (60) or the like is provided, and its output is connected to the source of transistor P2. As a result, in addition to the same advantages as those of the preceding examples, this example also has the following feature: with booster circuit portion (60) or the like being provided separately from conventional booster circuit portion (24), transistor BN1 can be controlled independently through transistor P2; hence, the circuit operation can be controlled appropriately.

Figure 11:
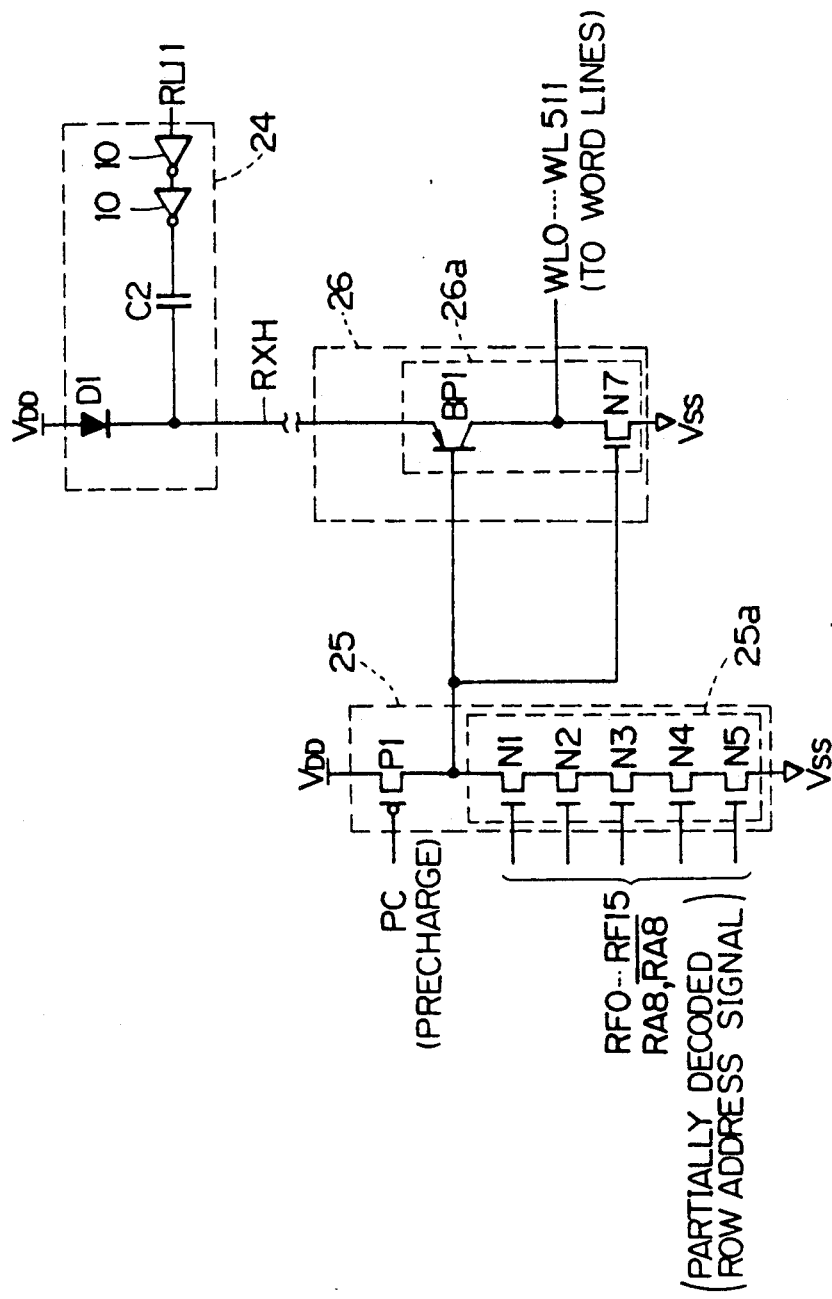

FIG. 11 illustrates yet another example of this invention. In this example, instead of NPN bipolar transistor BN1 as in the preceding examples, a PNP bipolar transistor BP1 is provided. That is, the emitter of PNP bipolar transistor BP1 is connected to signal RXH; its collector is connected to the drain of N-channel MOS transistor N7 and word lines (WL0-WL511); and the base of transistor BP1 is connected to the drain of P-channel MOS transistor P1 and the gate of N-channel MOS transistor N7. In this example, as PNP bipolar transistor BP1 is used in circuit block (26a) in word line driving circuit portion (26), there is no need to provide circuit block (25b) (inverter circuit) in X decoder portion (25) as in the aforementioned examples for performing the operation.

Now, with regard to the operation of the circuit in the example shown in FIG. 11, first, in the precharge state (i.e., when level "0" is input to the gate of P-channel MOS transistor P1), level "1" is input to the base of P1!P bipolar transistor BP1 and the gate of N-channel MOS transistor N7 from power supply voltage $V_{DD}$ through P-channel MOS transistor P1; hence, transistor BP1 is in the OFF state, while transistor N7 is in the ON state. As a result, word lines (WL0-WL511) are at level "0." Then, in the operation state, due to the selection signal of signals RF0-RF15, RA8, and RA8, as in the preceding examples, level "0" is input to the gates of transistors N1-N5 in X decoder portion (25); hence, the base of PNP bipolar transistor BP1 and the gate of N-channel MOS transistor N7 are at level "0." Hence, in this state, the predetermined voltage is supplied to the selected word line (for example, WL0) by signal RXH. As a result, this example also has the same advantages as in the preceding examples.

Although the invention has been illustrated hereinabove with embodiments, the above embodiments may be further modified based on the technical idea of the invention.

For example, a lateral NPN (or PNP) bipolar transistor may also be used, although a vertical type is used as a bipolar switching element in the above examples. Besides, other appropriate elements, such as resistors, etc. may also be provided. In addition, the connections of the elements may also be variously modified.

Furthermore, the circuit configurations of X decoder portion (25), word line driving circuit portion (26), booster circuit portion (24), etc., are not limited to the aforementioned examples. Other suitable circuit configurations and circuit forms may also be used.

The examples in which the invention is applied to a 1 M dynamic RAM have been described hereinabove, but the invention may also be applied to a 2 M dynamic RAM or the like, as well as to various devices such as a static RAM or the like.

Effects of the Invention

As explained above, according to this invention, a bipolar switching element is provided on the voltage supply circuit portion side of the driving signal output circuit portion; by an operation signal, the bipolar switching element outputs the voltage of the voltage supply circuit portion as a driving signal to the output line. Thus, in this configuration, the bipolar switching element can be preset to the state enabling output of the driving signal, and there is no need for controlling the timing or the like which is needed in the conventional case in which an MOS transistor is used as the switching element of the driving circuit. As a result, the time needed for controlling the timing or the like can be shortened.

Besides, as pointed out above, as a bipolar switching element is provided on the voltage supply circuit portion side of the driving signal output circuit portion, due to the high-speed operation ability of the bipolar switching element itself, the time can be more effectively shortened. Hence, this invention provides a driving circuit that can output the predetermined driving signal to the output line in a short time.

What is claimed is:

1. A driving circuit comprising:
    an operation signal supply circuit for receiving an input signal and having an output to provide an operation signal as an output signal;
    a power supply source from which a first predetermined voltage is provided as an output;

a booster circuit for providing a second predetermined voltage higher than said first predetermined voltage as an output;

a driving signal output circuit respectively connected to the outputs of said operation signal supply circuit and said booster circuit, said driving signal output circuit including a bipolar transistor having base, collector and emitter electrodes, an MOS transistor having source and drain regions and a gate electrode therebetween, one of the collector and emitter electrodes of said bipolar transistor being connected to one of the source and drain regions of said MOS transistor, an output line connected between said bipolar transistor and said MOS transistor, the other of the collector and emitter electrodes of said bipolar transistor being connected to the output of said booster circuit, and the other of the source and drain regions of said MOS transistor being connected to a reference potential;

the output of said operation signal supply circuit being connected to the base electrode of said bipolar transistor and to the gate electrode of said MOS transistor, the output of said operation signal supply circuit as connected to the base electrode of said bipolar transistor having an inverter control circuit interposed therein;

said power supply source being connected to the input of said inverter control circuit and to the gate electrode of said MOS transistor included in said driving signal output circuit;

a control MOS transistor interposed in the connection between said power supply source and the input of said inverter control circuit an the gate electrode of said MOS transistor included in said driving signal output circuit, said control MOS transistor having source and drain regions and a gate electrode therebetween;

a feedback line connected between the output of said inverter control circuit and the gate electrode of said control MOS transistor for controlling the application of said first predetermined voltage by said power supply source to the input of said inverter control circuit and the gate electrode of said MOS transistor included in said driving signal output circuit;

the output of said booster circuit being connected to said inverter control circuit and being provided as the output of said inverter control circuit for application to the base electrode of said bipolar transistor to render said bipolar transistor conductive in response to actuation of said inverter control circuit in one of two operating states;

said bipolar transistor when conductive transmitting said second predetermined voltage as provided by said booster circuit less the voltage drop across the conductive bipolar transistor to said output line as a boosted drive voltage higher than said first predetermined voltage provided by said power supply source; and the application of said first predetermined voltage from said power supply source to said inverter control circuit actuating said inverter control circuit in the other of two operating states to prevent the application of the output of said booster circuit as the output of said inverter control circuit to the base electrode of said bipolar transistor to render said bipolar transistor nonconductive and to the gate electrode of said MOS transistor included in said driving signal output circuit actuating said MOS transistor for connection to the reference potential.

2. A driving circuit as set forth in claim 1, wherein said inverter control circuit comprises first and second MOS transistors of opposite channel polarities and respectively having source and drain regions and a gate electrode between the source and drain regions thereof;

one of the source and drain regions of said first MOS transistor included in said inverter control circuit being connected to the output of said booster circuit;

the other of said source and drain regions of said first MOS transistor included in said inverter control circuit being connected to the corresponding other region of said second MOS transistor included in said inverter control circuit;

said one region of said second MOS transistor of said inverter control circuit being connected to the reference potential;

the gate electrodes of said first and second MOS transistors included in said inverter control circuit being the input thereof and being connected to said power supply source;

said first MOS transistor included in said inverter control circuit being rendered conductive and said second MOS transistor included in said inverter control circuit being rendered nonconductive in response to an output signal having a first logic state being provided by said operation signal supply circuit to the respective gate electrodes thereof to transmit said second predetermined voltage from said booster circuit via said first MOS transistor included in said inverter control circuit to the base electrode of said bipolar transistor; and said first MOS transistor included in said inverter control circuit being rendered non-conductive and said second MOS transistor included in said inverter control circuit being rendered conductive in response to an output signal having a second logic state different from said first logic state being provided by said operation signal supply circuit to the respective gate electrodes thereof to prevent the output of said booster circuit from being applied to the base electrode of said bipolar transistor and to apply the output signal having the second logic state to the gate electrode of said MOS transistor included in said driving signal output circuit rendering said MOS transistor included in said driving signal output circuit conductive.

3. A driving circuit as set forth in claim 1, wherein said bipolar transistor of said driving signal output circuit is an NPN transistor; and said MOS transistor of said driving signal output circuit is an N-channel MOS transistor;

the emitter electrode of said NPN bipolar transistor being connected to the drain region of said N-channel MOS transistor of said driving signal output circuit;

the collector electrode of said NPN bipolar transistor being connected to the output of said booster circuit; and the source region of said N-channel MOS transistor of said driving signal output circuit being connected to the reference potential.

4. A driving circuit as set forth in claim 1, wherein said operation signal supply circuit comprises a plurality of serially connected MOS transistors having respective gate electrodes defining a multiple input AND logic circuit for receiving selected digital inputs to provide an X-decoder portion for selection of the output line to receive the driving signal;

said power supply source being connected to the input of said plurality of serially connected MOS transistors;

a control MOS transistor having source and drain regions and a gate electrode connected therebetween interposed in the line between said power supply source and the input of said plurality of serially connected MOS transistors; and said control MOS transistor being rendered conductive in response to the application of a precharge signal to the gate electrode thereof for connecting the power supply source to said plurality of serially connected MOS transistors.

5. A driving circuit comprising:

an operation signal supply circuit for receiving an input signal and having an output to provide an operation signal as an output signal;

a power supply source from which a first predetermined voltage is provided as an output;

a booster circuit for providing a second predetermined voltage higher than said first predetermined voltage as an output;

a driving signal output circuit respectively connected to the outputs of said operation signal supply circuit and said booster circuit, said driving signal output circuit including:

a bipolar transistor having base, collector and emitter electrodes, an MOS transistor having source and drain regions and a gate electrode therebetween, one of the collector and emitter electrodes of said bipolar transistor being connected to one of the source and drain regions of said MOS transistor, an output line connected between said bipolar transistor and said MOS transistor, the other of the collector and emitter electrodes of said bipolar transistor being connected to the output of said booster circuit, and the other of the source and drain regions of said MOS transistor being connected to a reference potential;

the output of said operation signal supply circuit being connected to the base electrode of said bipolar transistor and to the gate electrode of said MOS transistor, the output of said operation signal supply circuit as connected to the base electrode of said bipolar transistor having an inverter control circuit interposed therein;

an isolation MOS transistor included in said operation signal supply circuit and connected to the input of said inverter control circuit and to the gate electrode of said MOS transistor included in said driving signal output circuit, said isolation MOS transistor having source and drain regions and a gate electrode therebetween;

said power supply source being connected to the gate electrode of said isolation MOS transistor;

said booster circuit including inverter means and a first capacitor connected in series;

said inverter means an said first capacitor of said booster circuit being connected to an output line from said power supply source;

a second capacitor connected between said first capacitor and said inverter means of said booster circuit and to the input of said inverter control circuit and the gate electrode of said MOS transistor included in said driving signal output circuit;

the output of said booster circuit being connected to said inverter control circuit and being provided as the output of said inverter control circuit for application to th base electrode of sid bipolar transistor to render said bipolar transistor conductive in response to actuation of said inverter control circuit in one of two operating states;

said bipolar transistor when conductive transmitting said second predetermined voltage as provided by said booster circuit less the voltage drop across the conductive bipolar transistor to said output line as a boosted drive voltage higher than said first predetermined voltage provided by said power supply source;

the application of said first predetermined voltage from said power supply source to the gate electrode of sid isolation MOS transistor enabling a primary voltage to be applied to the input of said inverter control circuit and said MOS transistor included in said driving signal output circuit; and said booster circuit and said second capacitor in the unselected state adding to the primary voltage applied to the input of said inverter control circuit to provide an increased voltage actuating said inverter control circuit in the other of two operating states to prevent the application of the output of said booster circuit as the output of said inverter control circuit to the base electrode of said bipolar transistor to render said bipolar transistor non-conductive and to the gate electrode of said MOS transistor included in said driving signal output circuit actuating said MOS transistor for connection to the reference potential.

6. A driving circuit as set forth in claim 5, wherein said inverter control circuit comprises first and second MOS transistors of opposite channel polarities and respectively having source and drain regions and a gate electrode between the source and drain regions thereof;

one of the source and drain regions of said first MOS transistor included in said inverter control circuit being connected to the output of said booster circuit;

the other of said source and drain regions of said first MOS transistor included in said inverter control circuit being connected to the corresponding other region of said second MOS transistor included in said inverter control circuit;

said one region of said second MOS transistor of said inverter control circuit being connected to the reference potential;

the gate electrodes of said first and second MOS transistors included in said inverter control circuit being the input thereof and being connected to said power supply source;

said first MOS transistor included in said inverter control circuit being rendered conductive and said second MOS transistor included in said inverter control circuit being rendered nonconductive in response to an output signal having a first logic state being provided by said operation signal supply circuit to the respective gate electrodes thereof to transmit said second predetermined voltage from said booster circuit via said first MOS transistor included in said inverter control circuit to the base electrode of said bipolar transistor; and said first MOS transistor included in said inverter control circuit being rendered non-conductive and said second MOS transistor included in said inverter control circuit being rendered conductive in response to an output signal having a second logic state different from said first logic state being provided by said operation signal supply circuit to the respective gate electrodes thereof to prevent the output of said booster circuit from being applied to the base electrode of said bipolar transistor and to apply the output signal having the second logic state to the gate electrode of said MOS transistor included in said driving signal output circuit rendering said MOS transistor included in said driving signal output circuit conductive.

7. A driving circuit as set forth in claim 5, wherein said bipolar transistor of said driving signal output circuit is an NPN transistor; and said MOS transistor of said driving signal output circuit is an N-channel MOS transistor;

the emitter electrode of said NPN bipolar transistor being connected to the drain region of said N-channel MOS transistor of said driving signal output circuit;

the collector electrode of said NPN bipolar transistor being connected to the output of said booster circuit; and the source region of said N-channel MOS transistor of said driving signal output circuit being connected to the reference potential.

8. A driving circuit as set forth in claim 5, wherein said power supply source is connected to the input of said isolation MOS transistor;

a control MOS transistor interposed in the connection between said power supply source and the input of said isolation MOS transistor, said control MOS transistor having source and drain regions and a gate electrode therebetween; and a feedback line connected between the output of said inverter control circuit and the gate electrode of said control MOS transistor for controlling the application of said first predetermined voltage by said power supply source to the input of said isolation MOS transistor.

9. A driving circuit as set forth in claim 5, wherein said operation signal supply circuit comprises a plurality of serially connected MOS transistors having respective gate electrodes defining a multiple input AND logic circuit for receiving selected digital inputs to provide an X-decoder portion for selection of the output line to receive the driving signal;

said power supply source being connected to the input of said plurality of serially connected MOS transistors;

a control MOS transistor having source and drain regions and a gate electrode connected therebetween interposed in the line between said power supply source and the input of said plurality of serially connected MOS transistors; and said control MOS transistor being rendered conductive in response to the application of a precharge signal to the gate electrode thereof for connecting the power supply source to said plurality of serially connected MOS transistors.

10. A driving circuit comprising:

an operation signal supply circuit for receiving an input signal and having an output to provide an operation signal as an output signal;

a power supply source from which a first predetermined voltage is provided as an output;

a first booster circuit for providing a second predetermined voltage higher than said first predetermined voltage as an output;

a driving signal output circuit respectively connected to the outputs of said operation signal supply circuit and said first booster circuit, said driving signal output circuit including:

a bipolar transistor having base, collector and emitter electrodes, an MOS transistor having source drain and regions and a gate electrode therebetween;

one of the collector and emitter electrodes of said bipolar transistor being connected to one of the source and drain regions of said MOS transistor, an output line connected between said bipolar transistor and said MOS transistor, the other of the collector and emitter electrodes of said bipolar transistor being connected to the output of said first booster circuit, and the other of the source and drain regions of said MOS transistor being connected to a reference potential;

the output of said operation signal supply circuit being connected to the base electrode of said bipolar transistor and to the gate electrode of said MOS transistor, the output of said operation signal supply circuit as connected to the base electrode of said bipolar transistor having an inverter control circuit interposed therein;

said power supply source being connected to the input of said inverter control circuit and to the gate electrode of said MOS transistor included in said driving signal output circuit;

a control MOS transistor interposed in the connection between said power supply source and the input of said inverter control circuit and the gate electrode of said MOS transistor included in said driving signal output circuit, said control MOS transistor having source and drain regions and a gate electrode therebetween;

a second booster circuit for providing a predetermined voltage as an output, said second booster circuit being connected to the inverter control circuit of said operation signal supply circuit for providing the output of said second booster circuit as the output of said inverter control circuit for application to the base electrode of said bipolar transistor to render said bipolar transistor conductive in response to actuation of sid inverter control circuit in one of two operating states;

said bipolar transistor when conductive transmitting said second predetermined voltage as provided by said first booster circuit less the voltage drop across the conductive bipolar transistor to said output line as a boosted drive voltage higher than said first predetermined voltage provided by said power supply source; and the application of said first predetermined voltage from said power supply source to said inverter control circuit actuating said inverter control circuit in the other of two operating states to prevent the application of the output of said second booster circuit as the output of said inverter control circuit to the base electrode of said bipolar transistor to render said bipolar transistor non-conductive and to the gate electrode of said MOS transistor included in said driving signal output circuit actuating said MOS transistor for connection to the reference potential.

11. A driving circuit as set forth in claim 10, wherein said inverter control circuit comprises first and second MOS transistors of opposite channel polarities and respectively having source and drain regions and a gate electrode between the source and drain regions thereof;

one of the source and drain regions of said first MOS transistor included in said inverter control circuit being connected to the output of said second booster circuit;

the other of said source and drain regions of said first MOS transistor included in said inverter control circuit being connected to the corresponding other region of said second MOS transistor included in said inverter control circuit;

said one region of said second MOS transistor of said inverter control circuit being connected to the reference potential;

the gate electrodes of said first and second MOS transistors included in said inverter control circuit being the input thereof and being connected to said power supply source;

said first MOS transistor included in said inverter control circuit being rendered conductive and said second MOS transistor included in said inverter control circuit being rendered nonconductive in response to an output signal having a first logic state being provided by said operation signal supply circuit to the respective gate electrodes thereof to transmit sid predetermined voltage from said second booster circuit via said first MOS transistor included in said inverter control circuit to the base electrode of said bipolar transistor; and said first MOS transistor included in said inverter control circuit being rendered non-conductive and said second MOS transistor included in said inverter control circuit being rendered conductive in response to an output signal having a second logic state different from said first logic state being provided by said operation signal supply circuit to the respective gate electrodes thereof to prevent the output of said second booster circuit from being applied to the base electrode of said bipolar transistor and to apply the output signal having the second logic state to the gate electrode of said MOS transistor included in said driving signal output circuit rendering said MOS transistor included in said driving signal output circuit conductive.

12. A driving circuit as set forth in claim 10, wherein said bipolar transistor of said driving signal output circuit is an NPN transistor; and said MOS transistor of said driving signal output circuit is an N-channel MOS transistor;

the emitter electrode of said NPN bipolar transistor being connected to the drain region of said N-channel MOS transistor of said driving signal output circuit;

the collector electrode of said NPN bipolar transistor being connected to the output of said first booster circuit; and the source region of said N-channel MOS transistor of said driving signal output circuit being connected to the reference potential.

13. A driving circuit as set forth in claim 10, wherein said operation signal supply circuit comprises a plurality of serially connected MOS transistors having respective gate electrodes defining a multiple input AND logic circuit for receiving selected digital inputs to provide an X-decoder portion for selection of the output line to receive the driving signal; and said power supply source and said control MOS transistor being connected to the input of said plurality of serially connected MOS transistors.

14. A driving circuit comprising:

an operation signal supply circuit for receiving an input signal and having an output to provide an operation signal as an output signal;

a power supply source from which a first predetemined voltage is provided as an output;

a booster circuit for providing a second predetermined voltage higher than said first predetermined voltage as an output;

a driving signal output circuit respectively connected to the outputs of said operation signal supply circuit and said booster circuit, said driving signal output circuit including a PNP bipolar transistor having base, collector and emitter electrodes, an N-channel MOS transistor having source and drain regions and a gate electrode therebetween, the collector electrode of said PNP bipolar transistor being connected to the drain region of said N-channel MOS transistor, an output line connected between said PNP bipolar transistor and said N-channel MOS transistor, the emitter electrode of said PNP bipolar transistor being connected to the output of said booster circuit, and the source region of said N-channel MOS transistor being connected to a reference potential;

the output of said operation signal supply circuit being connected to the base electrode of said PNP bipolar transistor and to the gate electrode of said N-channel MOS transistor;

said power supply source being connected to said operation signal supply circuit for application to the base electrode of said PNP bipolar transistor and to the gate electrode of said N-channel MOS transistor;

a control MOS transistor interposed in the connection between said power supply source and said operation signal supply circuit, said control MOS transistor having source and drain regions and a gate electrode therebetween;

said control MOS transistor being responsive to a precharge signal applied to the gate electrode thereof for transmitting said first predetermined voltage from said power supply source to the base electrode of said PNP bipolar transistor and to the gate electrode of said N-channel MOS transistor as the output of said operation signal supply circuit;

the application of said first predetermined voltage from said power supply source to the base electrode of said PNP bipolar transistor rendering said PNP bipolar transistor non-conductive and to the gate electrode of said N-channel MOS transistor included in said driving signal output circuit actuating said MOS transistor for connection to the reference potential; and said PNP bipolar transistor being rendered conductive in the absence of said first predetermined voltage from said power voltage source being applied to the base electrode thereof to transmit said second predetermined voltage as provided by said booster circuit less the voltage drop across the conductive PNP bipolar transistor to said output line as a boosted drive voltage higher than said first predetermined voltage provided by said power supply source.

15. A driving circuit as set forth in claim 14, wherein said operation signal supply circuit comprises a plurality of serially connected MOS transistors having respective gate electrodes defining a multiple input AND logic circuit for receiving selected digital inputs to provide an X-decoder portion for selection of the output line to receive the driving signal; and said power supply source and said control MOS transistor being connected to the input of said plurality of serial connected MOS transistors.

* * * * *